(12) United States Patent
Yoo et al.

(10) Patent No.: US 12,509,480 B2
(45) Date of Patent: Dec. 30, 2025

(54) ORGANOMETALLIC COMPLEX, LIGHT EMITTING DIODE, AND ELECTRONIC DEVICE

(71) Applicant: KOREA ADVANCED INSTITUTE OF SCIENCE AND TECHNOLOGY, Daejeon (KR)

(72) Inventors: Seunghyup Yoo, Daejeon (KR); Palanisamy Rajakannu, Daejeon (KR); Hyung Suk Kim, Daejeon (KR); Woochan Lee, Daejeon (KR)

(73) Assignee: KOREA ADVANCED INSTITUTE OF SCIENCE AND TECHNOLOGY, Daejeon (KR)

(*) Notice: Subject to any disclaimer, the term of this patent is extended or adjusted under 35 U.S.C. 154(b) by 892 days.

(21) Appl. No.: 17/750,702

(22) Filed: May 23, 2022

(65) Prior Publication Data

US 2023/0183279 A1 Jun. 15, 2023

(30) Foreign Application Priority Data

Oct. 26, 2021 (KR) .................. 10-2021-0143831

(51) Int. Cl.
*C07F 15/00* (2006.01)
*H10K 85/30* (2023.01)
(Continued)

(52) U.S. Cl.
CPC ....... *C07F 15/0086* (2013.01); *H10K 85/346* (2023.02); *H10K 85/654* (2023.02); *H10K 50/125* (2023.02); *H10K 2102/361* (2023.02)

(58) Field of Classification Search
None
See application file for complete search history.

(56) References Cited

U.S. PATENT DOCUMENTS

| 10,396,298 B2 | 8/2019 | Chi et al. |
| 10,640,525 B2 | 5/2020 | Chi et al. |
| 2021/0261588 A1* | 8/2021 | Che ................ H10K 85/346 |

FOREIGN PATENT DOCUMENTS

| CN | 103665049 | 3/2014 |
| CN | 103965885 | 8/2014 |

(Continued)

OTHER PUBLICATIONS

Korean written opinion (Year: 2025).*
(Continued)

*Primary Examiner* — Michael M Dollinger
(74) *Attorney, Agent, or Firm* — LEX IP MEISTER, PLLC

(57) ABSTRACT

Provided are an organometallic complex represented by Chemical Formula 1, a light emitting diode including the same, a display panel, a sensor, and an electronic device.

[Chemical Formula 1]

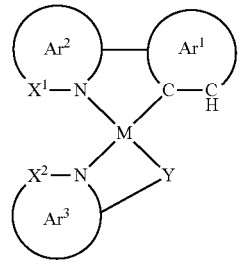

In Chemical Formula 1, M, $Ar^1$, $Ar^2$, $Ar^3$, $X^1$, $X^2$, and Y are as defined in the specification.

17 Claims, 3 Drawing Sheets

(51) Int. Cl.
  *H10K 85/60* (2023.01)
  *H10K 50/125* (2023.01)
  *H10K 102/00* (2023.01)

(56) References Cited

FOREIGN PATENT DOCUMENTS

| CN | 108341842 | | 7/2018 | |
|---|---|---|---|---|
| KR | 20220134335 | A * | 10/2022 | ............... C09D 5/00 |
| TW | 1611004 | X | 1/2018 | |
| TW | 201821418 | | 6/2018 | |
| WO | WO-2005123873 | A1 * | 12/2005 | ............. C09K 11/06 |
| WO | WO-2008136805 | A2 * | 11/2008 | ......... G01N 33/0057 |
| WO | WO-2014138912 | A1 * | 9/2014 | ......... A61K 49/0013 |

OTHER PUBLICATIONS

Scifinder Search History_Jun. 27, 2025_1303 (Year: 2025).*
Brulatti, Pierpaolo, et al. "Tuning the colour and efficiency in OLEDs by using amorphous or polycrystalline emitting layers." Journal of Materials Chemistry C 1.9 (Jan. 3, 2013): 1823-1831.
Chen, Wei-Chih, et al. "Low internal reorganization energy of the metal-metal-to-ligand charge transfer emission in dimeric Pt (II) complexes." The Journal of Physical Chemistry C 123.16 (Apr. 1, 2019): 10225-10236.
Palanisamy Rajakannu et al., "Naphthalene Benzimidazole Based Neutral Ir(III) Emitters for Deep Red Organic Light-Emitting Diodes", Inorg. Chem. 2020, 59, 12461-12470, Aug. 27, 2020.
Jia-Ling Liao et al., "Luminescent Diiridium Complexes with Bridging Pyrazolates: Characterization and Fabrication of OLEDs Using Vacuum Thermal Deposition", Adv. Optical Mater. 2018, 6, 1800083.
Kuan-Yu Liao et al., "Pt(II) Metal Complexes Tailored with a Newly Designed Spiro-Arranged Tetradentate Ligand; Harnessing of Charge-Transfer Phosphorescence and Fabrication of Sky Blue and White OLEDs", Inorg. Chem. 2015, 54, 4029-4038, Apr. 7, 2015.
Maya Chaaban et al., "Thiazol-2-thiolate-Bridged Binuclear Platinum(II) Complexes with High Photoluminescence Quantum Efficiencies of up to Near Unity", Inorg. Chem. 2020, 59, 13109-13116, Aug. 31, 2020.
Sheng Fu Wang et al., "Highly Efficient Near-Infrared Electroluminescence up to 800 nm Using Platinum(II) Phosphors", Adv. Funct. Mater. 2020, 30, 2002173.
Yu-Chen Wei et al., "Overcoming the energy gap law in near-infrared OLEDs by exciton-vibration decoupling", Nature photonics, vol. 14, p. 570 (2020).
Kiet Tuong Ly et al., "Near-infrared organic light-emitting diodes with very high external quantum efficiency and radiance", Nature photonics, vol. 11, p. 63 (2017).
Thomas Conrad Rosenow et al., "Near-infrared organic light emitting diodes based on heavy metal phthalocyanines", J. Appl. Phys. 103, 043105, Feb. 26, 2008; https://doi.org/10.1063/1.2888362.
L. Huang et al., "Platinum (II) azatetrabenzoporphyrins for near-infrared organic light emitting diodes", Applied Physics Letters 109, 233302 (2016).
Caifa You et al., "Boosting Efficiency of Near-Infrared Emitting Iridium(III) Phosphors by Administrating Their π-π Conjugation Effect of Core-Shell Structure in Solution-Processed OLEDs", Adv. Optical Mater. 2020, 8, 2000154.
Jonathan R. Sommer et al., "Efficient Near-Infrared Polymer and Organic Light-Emitting Diodes Based on Electrophosphorescence from (Tetraphenyltetranaphtho[2,3]porphyrin)-platinum(II)", ACS Appl. Mater. Interfaces 2009, 1, 2, 274-278.
Filippo Nisic et al., "Platinum(II) complexes with cyclometallated 5-p-delocalized-donor-1,3-di(2-pyridyl)benzene ligands as efficient phosphors for NIR-OLEDs", J. Mater. Chem. C, 2014, 2, 1791.
Linyu Cao et al., "Efficient and Stable Molecular-Aggregate-Based Organic Light-Emitting Diodes with Judicious Ligand Design", Adv. Mater. 2021, 33, 2101423.
Yu Kyung Moon et al., "Synthetic Strategy for Preserving Sky-Blue Electrophosphorescence in Square-Planar Pt(II) Complexes", ACS Appl. Electron. Mater. 2020, 2, 604-617, Feb. 4, 2020.
Jin-Suk Huh et al., "Highly Efficient Deep Blue Phosphorescent OLEDs Based on Tetradentate Pt(II) Complexes Containing Adamantyl Spacer Groups", Adv. Funct. Mater. 2021, 31, 2100967.

* cited by examiner

ORGANOMETALLIC COMPLEX, LIGHT EMITTING DIODE, AND ELECTRONIC DEVICE

This application claims priority to and the benefit of Korean Patent Application No. 10-2021-0143831 filed in the Korean Intellectual Property Office on Oct. 26, 2021, the entire contents of which are incorporated herein by reference.

BACKGROUND OF THE INVENTION

(a) Field of the Invention

An organometallic complex, a light emitting diode, and an electronic device are disclosed.

(b) Description of the Related Art

An electronic device such as a display panel, a sensor, or lighting may include an organic light emitting diode as a light emitting source. The organic light emitting diode is configured to convert electrical energy into light, and performance of the organic light emitting diode is greatly affected by an organic light emitter positioned between electrodes.

Recently, in order to improve performance of the display panel or the sensor in a low-light environment or to use it as a biometric device or a security device, research on an organic light emitting diode configured to emit light in a near-infrared wavelength spectrum is in progress.

SUMMARY OF THE INVENTION

An embodiment provides an organometallic complex capable of effectively emitting light in the near-infrared wavelength spectrum.

Another embodiment provides a light emitting diode including the organometallic complex.

Another embodiment provides a display panel including the organometallic complex or the light emitting diode.

Another embodiment provides a sensor including the organometallic complex or the light emitting diode.

Another embodiment provides an electronic device including the organometallic complex, the light emitting diode, the display panel, or the sensor.

According to an embodiment, an organometallic complex represented by Chemical Formula 1 is provided.

[Chemical Formula 1]

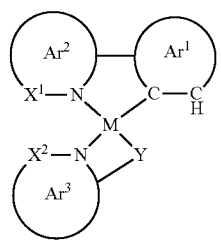

In Chemical Formula 1,
M is a transition metal,
$Ar^1$ is a substituted or unsubstituted C6 to C20 arylene group,
$Ar^2$ and $Ar^3$ are different from each other and are each independently a heterocyclic group including at least one nitrogen,
one of $X^1$ and $X^2$ is N and the other of $X^1$ and $X^2$ is CH, and
Y is a heterocyclic group including at least one nitrogen or —OC(=O)—.

In Chemical Formula 1, $X^1$ may be N, $X^2$ may be CH, $Ar^2$ may be a substituted or unsubstituted pyridazinylene, and $Ar^3$ may be a substituted or unsubstituted pyridinylene group or a substituted or unsubstituted pyrazinylene group.

In Chemical Formula 1, $X^1$ may be CH, $X^2$ may be N, $Ar^2$ may be a substituted or unsubstituted pyridinylene group or a substituted or unsubstituted pyrazinylene group, and $Ar^3$ is a substituted or unsubstituted pyridazinylene group.

$Ar^1$ may be a substituted or unsubstituted phenylene group.

Y may be a substituted or unsubstituted pyrazolylene group.

M may be Pt, Pd, Ni, Ir, Rh, Mn, Fe, Co, Zn, Au, Cu, or Cr.

The organometallic complex represented by Chemical Formula 1 may be represented by Chemical Formula 1A or 1B.

[Chemical Formula 1A]

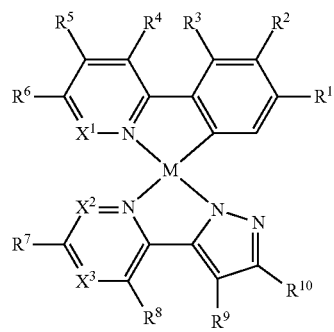

[Chemical Formula 1B]

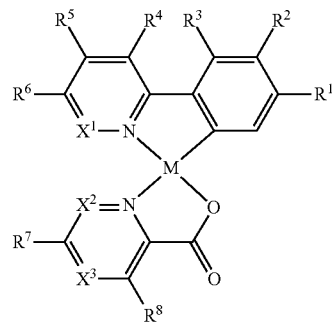

In Chemical Formula 1A or 1B,
M is a transition metal,
one of $X^1$ and $X^2$ is N and the other of $X^1$ and $X^2$ is CH,
$X^3$ is N or $CR^a$, and
$R^1$ to $R^{10}$ and $R^a$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a halogen, a cyano group, or a combination thereof.

At least two of $R^1$ to $R^{10}$ and $R^a$ may be a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a halogen, a cyano group, or a combination thereof.

At least one of $R^1$ to $R^3$ may be a substituted or unsubstituted C3 to C30 branched alkyl group, a substituted or unsubstituted C1 to C30 alkoxy group, a halogen, a C1 to C30 haloalkyl group, or a combination thereof, and at least one of $R^4$ to $R^6$ may be a substituted or unsubstituted C1 to C30 alkyl group, a substituted or unsubstituted C1 to C30 alkoxy group, or a combination thereof.

The compound represented by Chemical Formula 1A may be represented by Chemical Formula 1AA or 1AB, and the compound represented by Chemical Formula 1B may be represented by Chemical Formula 1BA or 1BB.

[Chemical Formula 1AA]

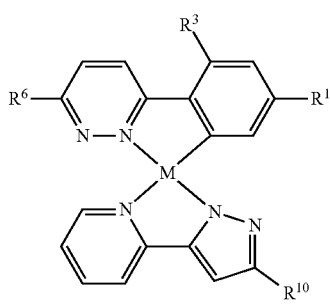

[Chemical Formula 1AB]

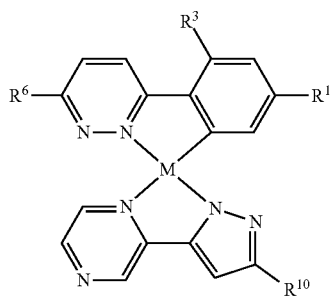

[Chemical Formula 1BA]

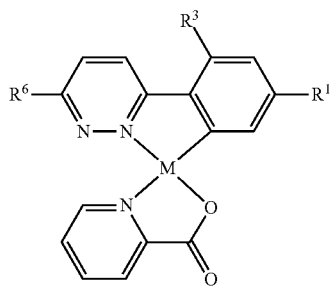

[Chemical Formula 1BB]

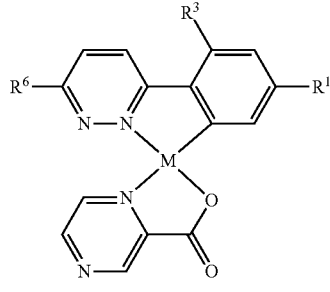

In Chemical Formula 1AA, 1AB, 1BA, or 1BB, $R^1$, $R^3$, $R^6$, and $R^{10}$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a halogen, a cyano group, or a combination thereof.

$R^1$ may be hydrogen, a substituted or unsubstituted C3 to C30 branched alkyl group, a substituted or unsubstituted C1 to C30 alkoxy group, a halogen, a C1 to C30 haloalkyl group, or a combination thereof, $R^6$ may be a substituted or unsubstituted C1 to C30 linear alkyl group, a substituted or unsubstituted C3 to C30 branched alkyl group, a substituted or unsubstituted C1 to C30 alkoxy group, or a combination thereof, and $R^{10}$ may be a phenyl group, a naphthyl group, an anthracenyl group, a halogen, a C1 to C30 haloalkyl group, C6 to C30 haloaryl group, a substituted or unsubstituted pyridinyl group, a substituted or unsubstituted pyrimidinyl group, a substituted or unsubstituted triazinyl group, or a combination thereof.

The organometallic complex may be one of the compounds listed in Group 3.

[Group 3]

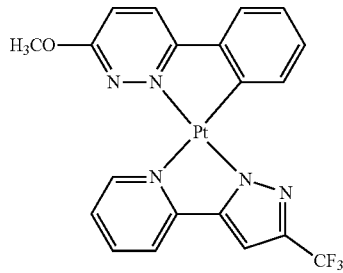

1

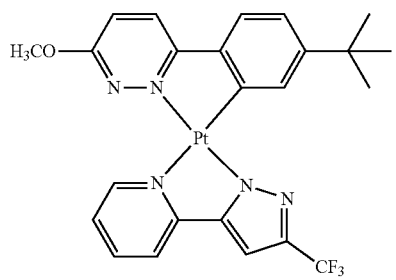

2

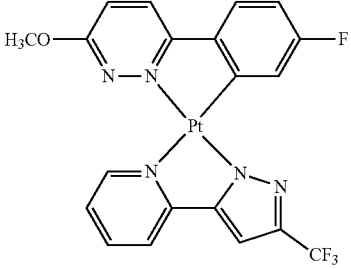

3

4
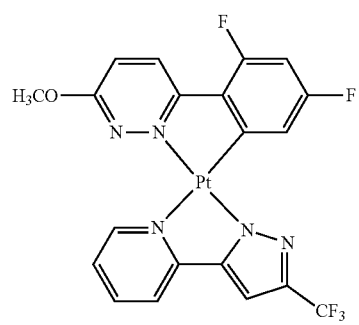
5
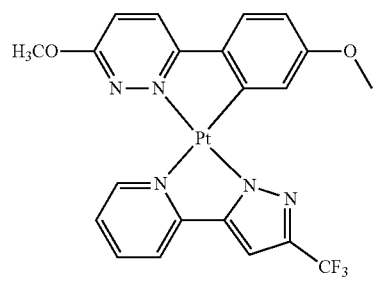
6
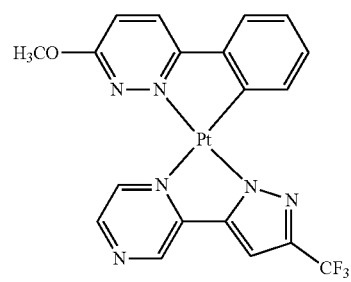
7
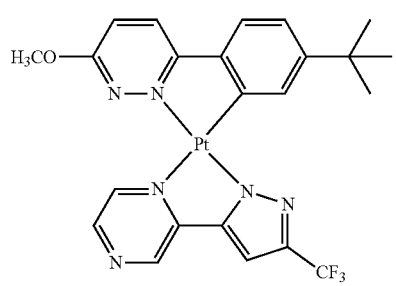
8
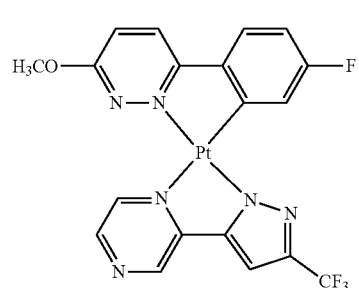
9
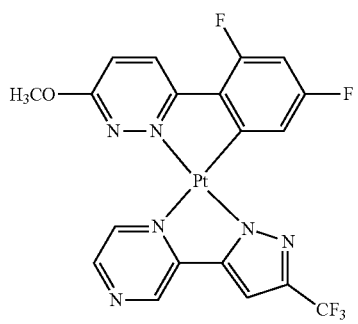
10
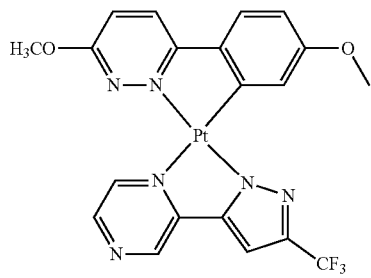
11
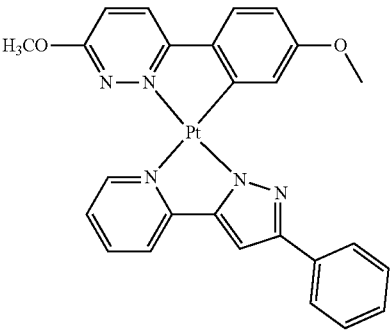
12
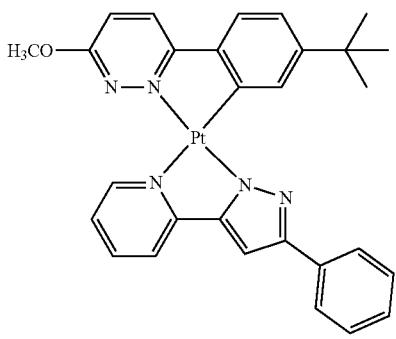
13
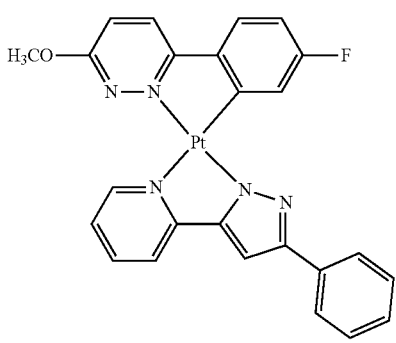

14
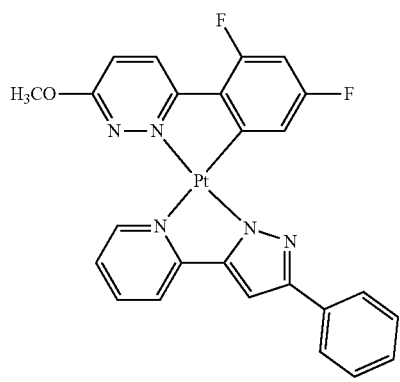
15
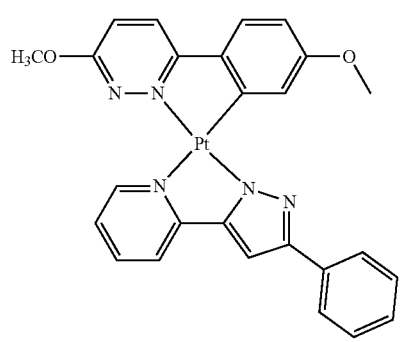
16
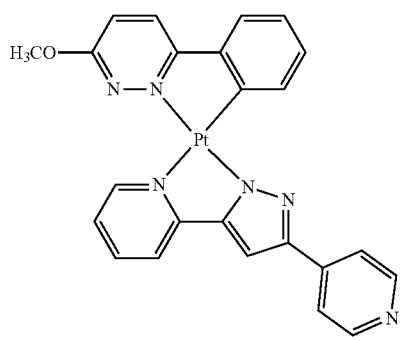
17
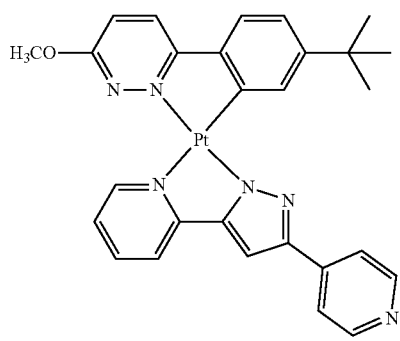
18
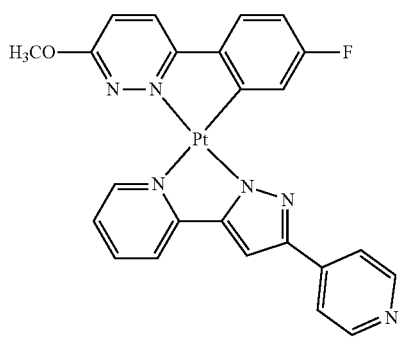
19
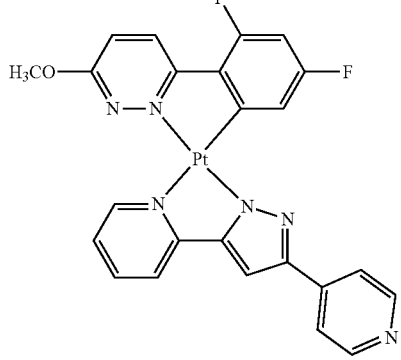
20
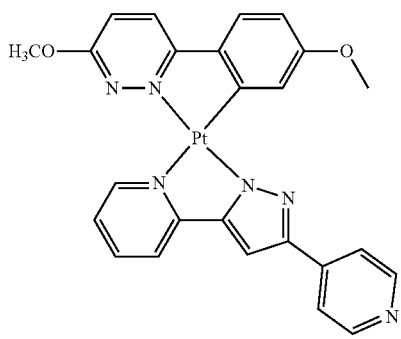
21
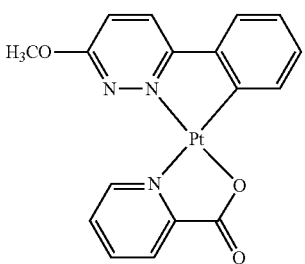
22
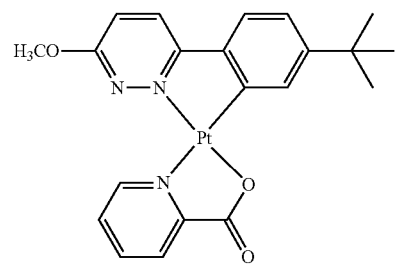

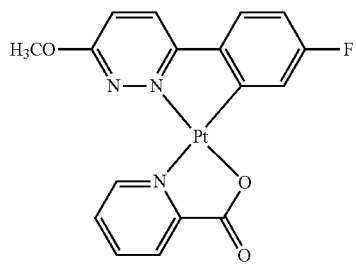

23

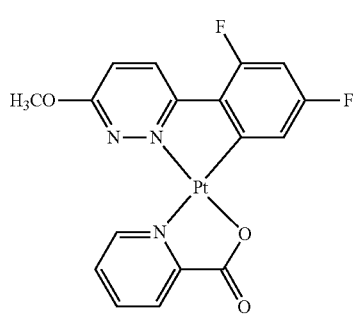

24

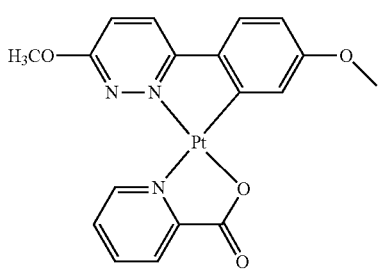

25

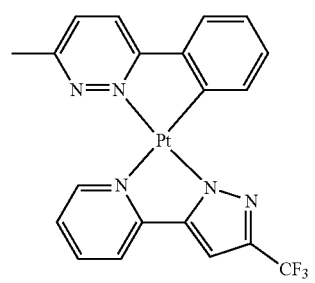

26

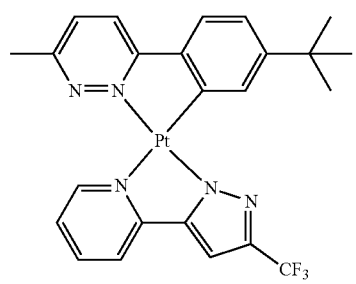

27

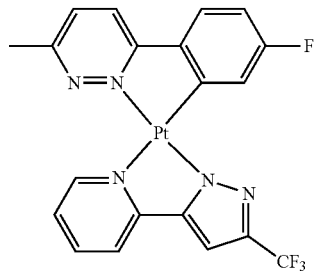

28

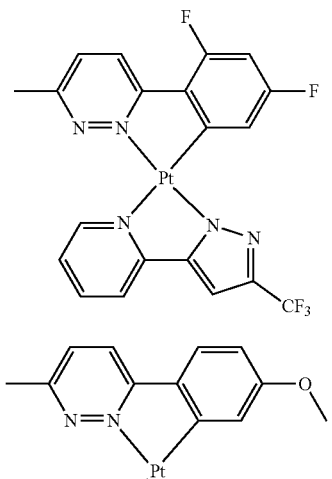

29

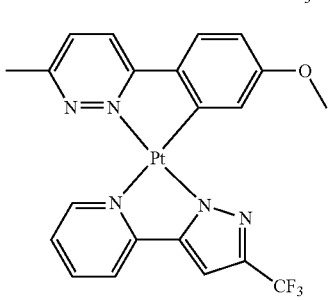

30

In a thermogravimetric analysis of the organometallic complex, a temperature at which a weight loss of 5% compared to an initial weight occurs may be greater than or equal to about 300° C.

A peak wavelength of an emission spectrum of the organometallic complex in a solid state (film state) may be located at a longer wavelength than a peak wavelength of the emission spectrum of the organometallic complex in a solution state.

According to another embodiment, a light emitting diode includes a first electrode and a second electrode, and a light emitting layer between the first electrode and the second electrode, wherein the light emitting layer includes the organometallic complex.

A peak wavelength of the emission spectrum of the light emitting layer may be within about 580 nm to 1200 nm.

According to another embodiment, a sensor including the organometallic complex or the light emitting diode is provided.

According to another embodiment, a display panel including the organometallic complex, the light emitting diode, or the sensor is provided.

According to another embodiment, an electronic device including the organometallic complex, the light emitting diode, the sensor, or the display panel is provided.

A light emitting material capable of effectively controlling the emission wavelength in a visible to near-infrared wavelength spectrum may be provided, and thus may be effectively applied to various fields requiring light emission in the deep red to near-infrared wavelength region.

DETAILED DESCRIPTION OF THE EMBODIMENTS

Figure 1:
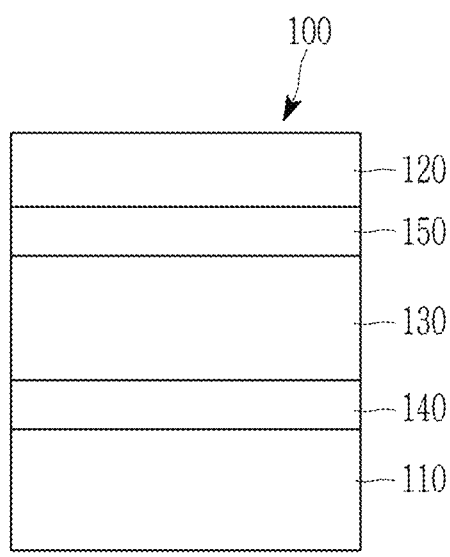
FIG. 1 is a cross-sectional view showing an example of a light emitting diode according to an embodiment.

Hereinafter, the embodiments will be described in detail so that those of ordinary skill in the art can easily implement them. However, the actually applied structure may be implemented in several different forms and is not limited to the embodiments described herein.

In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, "substituted" refers to replacement of a hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C30 thioalkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, "hetero" refers to one including 1 to 4 heteroatoms of N, O, S, Se, Te, Si, or P.

Hereinafter, as used herein, when a definition is not otherwise provided, "aryl group" (or "arylene group") refers to a group including at least one hydrocarbon aromatic moiety. All the elements of the hydrocarbon aromatic moiety have p-orbitals which form conjugation, for example a phenyl group (phenylene group), a naphthyl group (naphthylene group), and the like; two or more hydrocarbon aromatic moieties may be linked by a sigma bond, for example a biphenyl group (biphenylene group), a terphenyl group (terphenylene group), a quaterphenyl group (quaterphenylene group), and the like; and two or more hydrocarbon aromatic moieties are fused directly or indirectly to provide a non-aromatic fused ring, for example a fluorenyl group (fluorenylene group). The aryl group (arylene group) may include a monocyclic, polycyclic, or fused ring polycyclic (i.e., rings sharing adjacent pairs of carbon atoms) functional group.

Hereinafter, as used herein, when a definition is not otherwise provided, "heterocycle" or "heterocyclic group" is a generic concept of a heteroaryl group, and may include at least one heteroatom selected from N, O, S, Se, Te, P, and Si instead of carbon (C) in the ring. When the heterocycle is a fused ring, the entire ring or each ring of the heterocycle may include one or more heteroatoms.

Hereinafter, a work function, a HOMO energy level, or a LUMO energy level is expressed as an absolute value from a vacuum level. In addition, when the work function, HOMO energy level, or LUMO energy level is referred to be deep, high, or large, it may have a large absolute value based on "0 eV" of the vacuum level while when the work function, HOMO energy level, or LUMO energy level is referred to be shallow, low, or small, it may have a small absolute value based on "0 eV" of the vacuum level.

Hereinafter, an energy bandgap refers to an absolute value of a difference between the HOMO energy level and the LUMO energy level, and the wide energy bandgap means that an absolute value of the difference between the HOMO energy level and the LUMO energy level is large.

Hereinafter, an organometallic complex according to an embodiment is described.

The organometallic complex according to an embodiment may include a central metal and organic ligands having different structures linked to the central metal, and each organic ligand may be a bi-dentate organic ligand with two atoms that can be coordinated to a central metal.

For example, the organometallic complex may include a first organic ligand and a second organic ligand respectively linked to a central metal, and the first organic ligand and the second organic ligand may have different structures.

The first organic ligand and the second organic ligand may be capable of forming an intramolecular hydrogen bond, and the first organic ligand and the second organic ligand may include one or more donating moieties and/or one or more accepting moieties which are capable of forming an intramolecular hydrogen bond. The donating moiety capable of forming a hydrogen bond may be a hydrogen-containing moiety and the accepting moiety capable of forming a hydrogen bond may be an N- and/or O-containing moiety.

For example, one of the first organic ligand and the second organic ligand may include one or more donating moieties and the other of the first organic ligand and the second organic ligand may include one or more accepting moieties. For example, the first organic ligand and the second organic ligand may each include one or more donating moieties and one or more accepting moieties.

For example, the first organic ligand may include a substituted or unsubstituted 5-membered ring having a donating moiety, a substituted or unsubstituted 6-membered ring having a donating moiety, or a combination thereof, and may include, for example, an aryl group (arylene group) in which a hydrogen (H) is bonded at the 3-position.

For example, the first organic ligand may further include a substituted or unsubstituted 5-membered ring having a donating moiety, a substituted or unsubstituted 6-membered ring having a donating moiety, or a combination thereof, and/or a substituted or unsubstituted 5-membered ring having an accepting moiety, a substituted or unsubstituted 6-membered ring having an accepting moiety, or a combination thereof.

For example, the first organic ligand may include two substituted or unsubstituted rings bonded by a single bond, wherein one of the two rings may be a substituted or unsubstituted nitrogen-containing heterocycle, and the other may be a substituted or unsubstituted aryl group.

For example, the second organic ligand may include a substituted or unsubstituted 5-membered ring having a donating moiety, a substituted or unsubstituted 6-membered ring having a donating moiety, or a combination thereof, and may be, for example, substituted or unsubstituted nitrogen-containing heterocycles bonded by a single bond.

The organometallic complex may form a square planar molecular geometry (SP) by such intramolecular hydrogen bond, for example, a perfect square planar molecular geometry (PSP).

As an example, the organometallic complex may be represented by Chemical Formula 1.

[Chemical Formula 1]

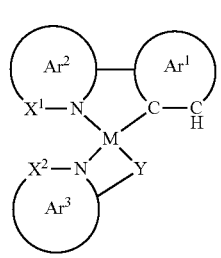

In Chemical Formula 1,
M may be a transition metal as a central metal,
$Ar^1$ may be a substituted or unsubstituted C6 to C20 arylene group,
$Ar^2$ and $Ar^3$ may each independently be a heterocyclic group including at least one nitrogen,
one of $X^1$ and $X^2$ may be N and the other of $X^1$ and $X^2$ may be CH, and
Y may be a heterocyclic group including at least one nitrogen or —OC(=O)—.

The organometallic complex represented by Chemical Formula 1 includes a first organic ligand (a ligand including $Ar^1$—$Ar^2$) and a second organic ligand (a ligand including $Ar^3$—Y) bonded to a central metal (M). The first organic ligand and the second organic ligand may form an intramolecular hydrogen bond. For example, the donating moiety of $Ar^1$ (e.g., CH) and the accepting moiety of Y (e.g., N or O) of the first organic ligand can form an intramolecular hydrogen bond and for example, a donating moiety of $Ar^2$ of a first organic ligand (e.g., when $X^1$ is CH) and an accepting moiety of $Ar^3$ (e.g., when $X^2$ is N) or an accepting moiety of $Ar^2$ of a first organic ligand (e.g., when $X^1$ is CH) and the donating moiety of $Ar^3$ (e.g., when $X^2$ is CH) may form intramolecular hydrogen bonds.

Accordingly, in the organometallic complex represented by Chemical Formula 1, a first organic ligand and a second organic ligand, which are bi-dentate organic ligands, may be bonded to a central metal, respectively, and an intramolecular hydrogen bond may be formed between the first organic ligand and the second organic ligand. Thereby, a square planar molecular structure (SP) or a perfect planar molecular structure (PSP) may be formed as described above.

For example, M may be Pt, Pd, Ni, Ir, Rh, Mn, Fe, Co, Zn, Au, Cu, or Cr, for example, may be Pt or Pd, or for example may be Pt.

For example, $Ar^1$ may be a substituted or unsubstituted phenylene group, a substituted or unsubstituted naphthylene group, a substituted or unsubstituted anthracenylene group, or a substituted or unsubstituted pyrenylene group. For example, $Ar^1$ may be a substituted or unsubstituted phenylene group.

For example, $Ar^2$ and $Ar^3$ may be different from each other and may each independently be a pentagonal or hexagonal cyclic group including at least one nitrogen.

For example, $X^1$ may be nitrogen (N), $X^2$ may be CH, $Ar^2$ may be a substituted or unsubstituted pyridazinylene group, and $Ar^3$ may be a substituted or unsubstituted pyridinylene group, or a substituted or unsubstituted pyrazinylene group. $X^1$ and $X^2$ may form an intramolecular hydrogen bond.

For example, $X^1$ may be CH, $X^2$ may be nitrogen (N), $Ar^2$ may be a substituted or unsubstituted pyridinylene group or a substituted or unsubstituted pyrazinylene group, and $Ar^3$ may be a substituted or unsubstituted pyridazinylene group. $X^1$ and $X^2$ may form an intramolecular hydrogen bond.

Y may include an accepting moiety for forming a hydrogen bond, and may be a pentagonal cyclic group including at least one nitrogen, a hexagonal cyclic group including at least one nitrogen, or a fused ring thereof, or —OC(=O)—. For example, Y may be a substituted or unsubstituted pyrazolylene group.

For example, the organometallic complex represented by Chemical Formula 1 may be represented by Chemical Formula 1A or 1B.

[Chemical Formula 1A]

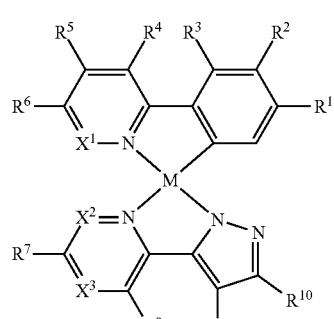

[Chemical Formula 1B]

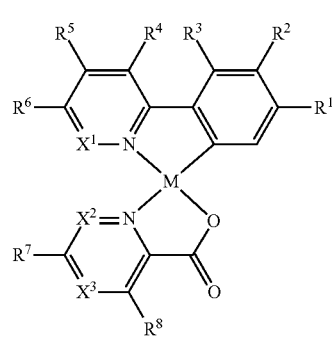

In Chemical Formula 1A or 1B,
M, $X^1$, and $X^2$ are each as described above,
$X^3$ may be N or $CR^a$, and
$R^1$ to $R^{10}$ and $R^a$ may each independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a halogen, a cyano group, or a combination thereof.

For example, the organometallic complex represented by Chemical Formula 1A or 1B may be substituted with at least one substituent, and at least one of $R^1$ to $R^{10}$ and $R^a$ may be a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a halogen, a cyano group, or a combination thereof.

For example, the organometallic complex represented by Chemical Formula 1A or 1B may be substituted with at least two substituents, and at least two of $R^1$ to $R^{10}$ and $R^a$ may be a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a halogen, a cyano group, or a combination thereof.

For example, in Chemical Formula 1A or 1B, the phenylene group of the first organic ligand may be substituted with at least one substituent, and at least one of $R^1$ to $R^3$ may be, for example, a substituted or unsubstituted C3 to C30 branched alkyl group, a substituted or unsubstituted C1 to C30 alkoxy group, a halogen, a C1 to C30 haloalkyl group, or a combination thereof.

For example, in Chemical Formula 1A or 1B, the nitrogen-containing ring of the first organic ligand may be substituted with at least one substituent, and at least one of $R^4$ to $R^6$ may be, for example, a substituted or unsubstituted C1 to C30 linear alkyl group, a substituted or unsubstituted C3 to C30 branched alkyl group, a substituted or unsubstituted C1 to C30 alkoxy group, a halogen, a C1 to C30 haloalkyl group, or a combination thereof. For example, at least one of $R^4$ to $R^6$ may be a substituted or unsubstituted C1 to C30 linear alkyl group or a substituted or unsubstituted C1 to C30 alkoxy group.

For example, in Chemical Formula 1A, the pyrazolylene group of the second organic ligand may be substituted with at least one substituent, and at least one of $R^9$ and $R^{10}$ may be a substituted or unsubstituted C1 to C30 linear alkyl group, a substituted or unsubstituted C3 to C30 branched alkyl group, a substituted or unsubstituted C1 to C30 alkoxy group, a substituted or unsubstituted C6 to C30 aryl group, a substituted or unsubstituted C3 to C30 heterocyclic group, a halogen, a cyano group, or a combination thereof. For example, at least one of $R^9$ and $R^{10}$ may be a substituted or unsubstituted C3 to C30 branched alkyl group, a substituted or unsubstituted C1 to C30 alkoxy group, a halogen, a C1 to C30 haloalkyl group, or a combination thereof.

For example, the compound represented by Chemical Formula 1A may be represented by Chemical Formula 1AA or 1AB below.

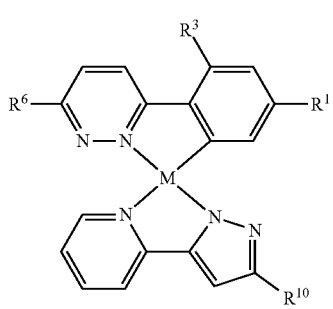

[Chemical Formula 1AA]

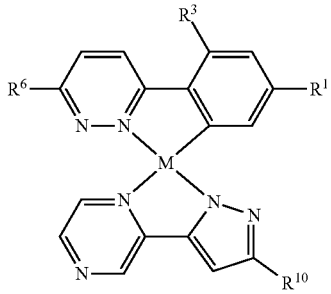

[Chemical Formula 1AB]

In Chemical Formula 1AA or 1AB, M, $R^1$, $R^3$, $R^6$, and $R^{10}$ are the same as described above.

For example, the compound represented by Chemical Formula 1B May be represented by Chemical Formula 1BA or 1BB.

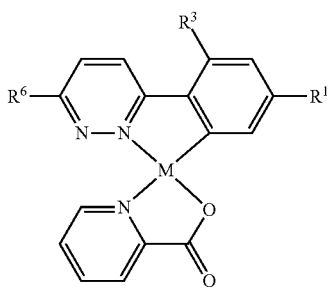

[Chemical Formula 1BA]

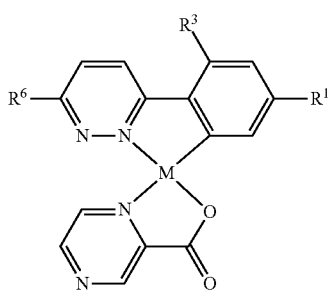

[Chemical Formula 1BB]

In Chemical Formula 1BA or 1BB, M, M, $R^1$, $R^3$, and $R^6$ are the same as described above.

For example, in Chemical Formula 1AA, 1AB, 1BA, or 1BB, $R^1$, $R^3$, $R^6$, and $R^{10}$ may each independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a halogen, a cyano group, or a combination thereof.

For example, in Chemical Formula 1AA, 1AB, 1BA, or 1BB, $R^1$ may be hydrogen, a substituted or unsubstituted C3 to C30 branched alkyl group, a substituted or unsubstituted C1 to C30 alkoxy group, a halogen, a C1 to C30 haloalkyl group, or a combination thereof, $R^6$ may be a substituted or unsubstituted C1 to C30 linear alkyl group, a substituted or unsubstituted C3 to C30 branched alkyl group, a substituted or unsubstituted C1 to C30 alkoxy group, or a combination thereof, and $R^{10}$ may be a phenyl group, a naphthyl group, an anthracenyl group, a halogen, a C1 to C30 haloalkyl group, a C6 to C30 haloaryl group, a substituted or unsubstituted pyridinyl group, a substituted or unsubstituted pyrimidinyl group, a substituted or unsubstituted triazinyl group, or a combination thereof.

For example, the first organic ligand may be derived from the compounds listed in Group 1.

[Group 1]

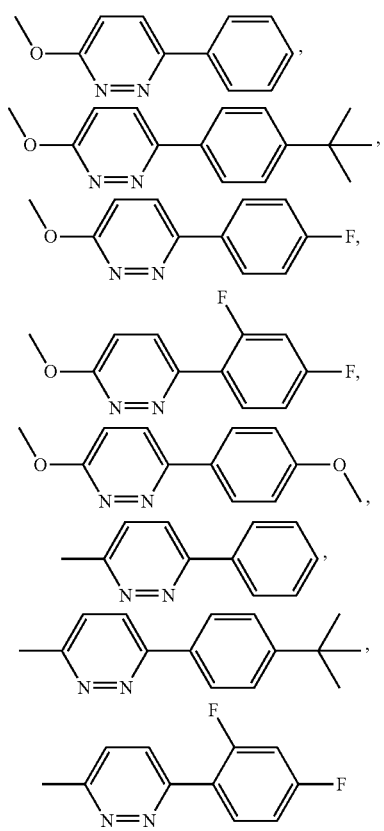

For example, the second organic ligand may be derived from compounds in Group 2.

[Group 2]

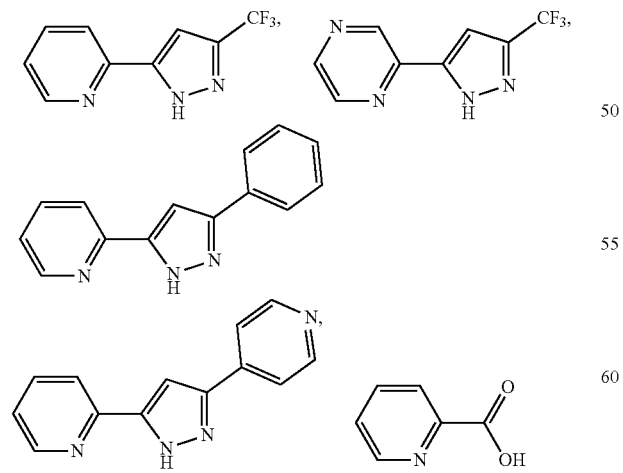

The organometallic complex may be, for example, one of the compounds listed in Group 3, but is not limited thereto.

[Group 3]

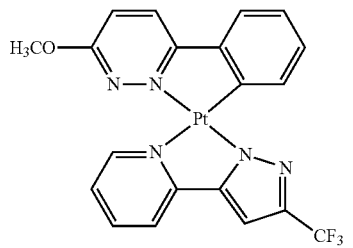

1

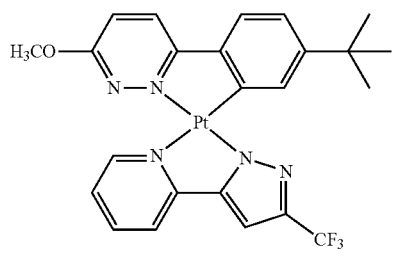

2

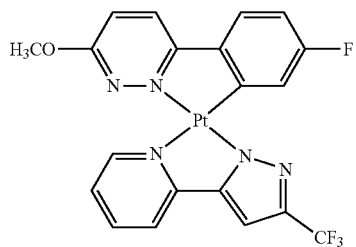

3

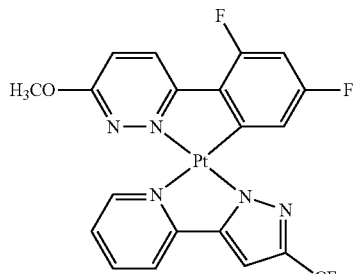

4

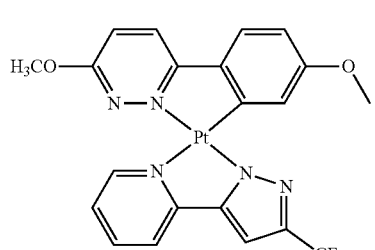

5

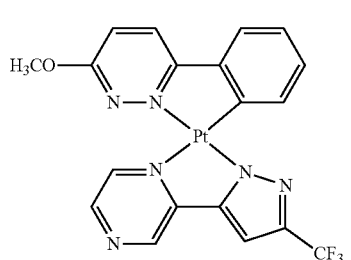

6

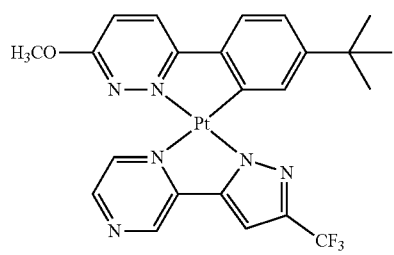
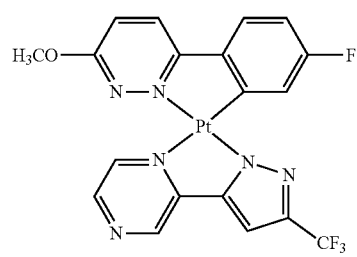
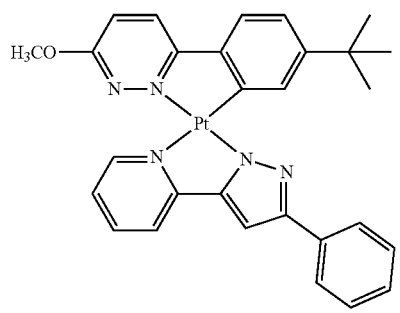
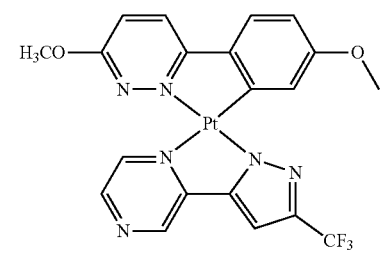
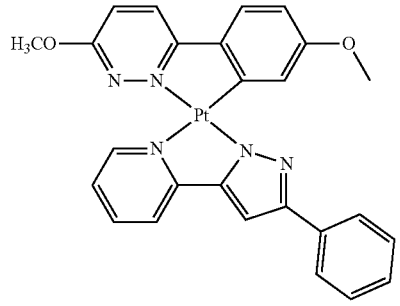
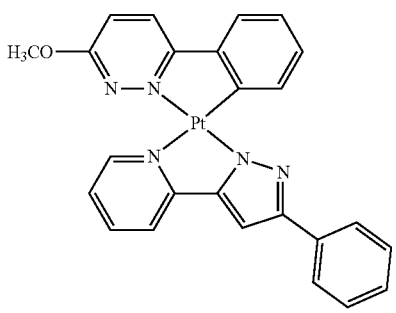

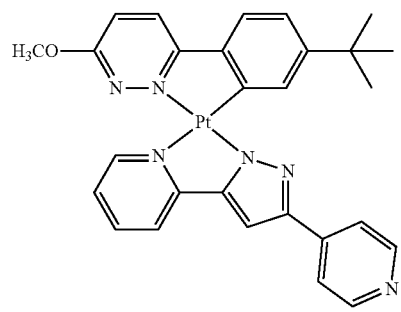
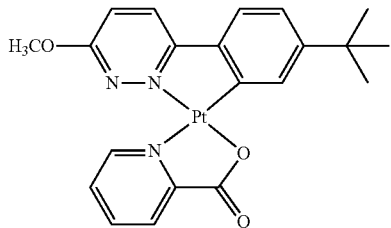
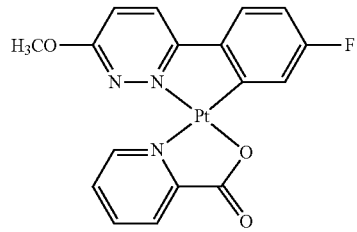
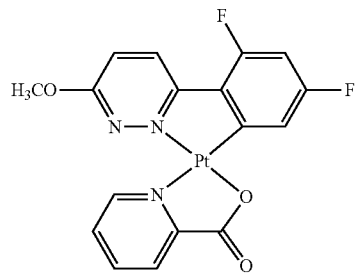
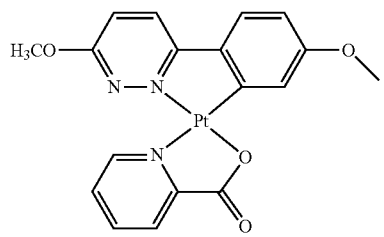
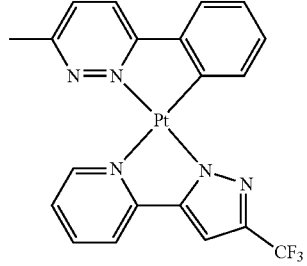
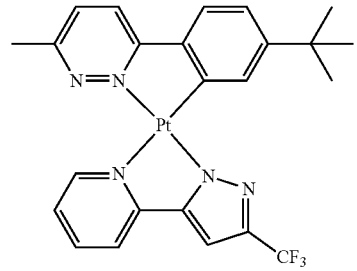

-continued

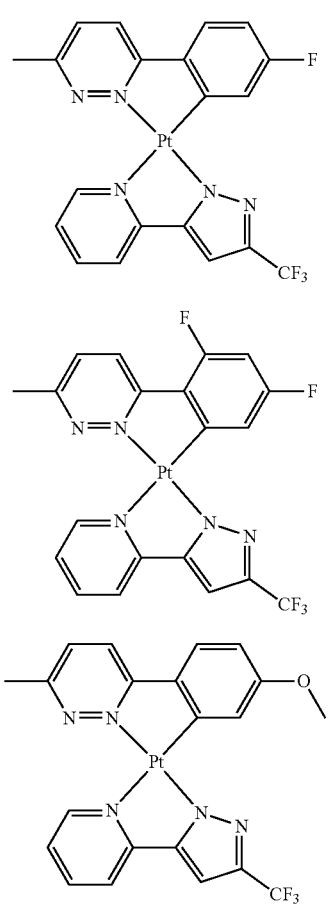

The organometallic complex may be a light emitting material, and may be, for example, a photoluminescent material configured to receive light energy and emit light in a portion of a visible to near-infrared wavelength spectrum and/or an electroluminescent material configured to receive electrical energy and emit light in a portion of a visible to near-infrared wavelength spectrum. The organometallic complex may be, for example, a phosphorescent material in which energy is transferred from a singlet excited state to a triplet excited state and consequently emits light from an exciton in the triplet excited state.

The HOMO energy level and the LUMO energy level of the organometallic complex may be about 5.4 eV to about 6.1 eV and about 2.1 eV to about 2.7 eV, respectively, and according to these energy levels, the emission spectrum of the organometallic complex may have a peak wavelength in a visible to near-infrared wavelength spectrum.

In particular, the organometallic complex in a solid state (e.g., powder or film) may additionally form interactions (M-M) between the central metals (M) of adjacent organometallic complexes and intermolecular hydrogen bonds between adjacent organometallic complexes in addition to the aforementioned intramolecular hydrogen bonds. Interactions between the central metals and intermolecular hydrogen bonds in such a solid state may form stable stacking interactions between molecules and exhibit metal-metal-to-ligand charge transfer (MMLCT) properties. In this case, the peak wavelength of the emission spectrum of the organometallic complex in the solid state may be shifted to a longer wavelength.

For example, the peak wavelength of the emission spectrum of the organometallic complex in a solution state may belong to a visible light wavelength spectrum, such as a blue wavelength spectrum, a green wavelength spectrum, and a red wavelength spectrum, whereas the peak wavelength of the emission spectrum of the organometallic complex in a solid state may be a longer wavelength, and for example, may belong to a deep red to near-infrared (NIR) wavelength spectrum. Herein, the solution may be prepared by dissolving the organometallic complex in a solvent capable of dissolving the organometallic complex and not affecting the light absorption characteristics. The solvent may be, for example, dimethyl sulfoxide (DMSO), toluene, dichloromethane, chloroform, or a combination thereof, and the concentration may be, for example, about $1 \times 10^{-5}$ M to about $5 \times 10^{-5}$ M, but is not limited thereto. The solid state may be a powder or a thin film.

For example, the peak wavelength of the emission spectrum of the organometallic complex in a solid state may be shifted toward a longer wavelength by about 10 nm or more, within the above range, about 20 nm or more, about 30 nm or more, about 40 nm or more, about 50 nm or more, about 60 nm or more, about 70 nm or more, or within the above range, about 10 nm to about 300 nm, about 20 nm to about 300 nm, about 30 nm to about 300 nm, about 40 nm to about 300 nm, about 50 nm to about 300 nm, about 60 nm to about 300 nm, or about 70 nm to about 300 nm than the peak wavelength of the emission spectrum of the organometallic complex in a solution state.

For example, the peak wavelength of the emission spectrum of the organometallic complex in a solution state may belong to about 380 nm to about 700 nm, or within the above range, about 400 nm to about 680 nm, about 430 nm to about 680 nm, or about 480 nm to about 650 nm.

For example, the peak wavelength of the emission spectrum of the organometallic complex in the powder state may belong to about 500 nm to 1200 nm, or within the above range, about 550 nm to about 1200 nm, about 580 nm to about 1100 nm, about 620 nm to about 1100 nm, about 650 nm to about 1050 nm, about 680 nm to about 1000 nm, about 700 nm to about 1000 nm, or about 710 nm to about 1000 nm.

For example, the peak wavelength of the emission spectrum of the organometallic complex in a thin film state may belong to about 580 nm to about 1200 nm, or within the above range, about 600 nm to about 1200 nm, about 610 nm to about 1200 nm, about 620 nm to about 1200 nm, about 650 nm to about 1200 nm, about 680 nm to about 1100 nm, about 700 nm to about 1050 nm, about 710 nm to about 1000 nm, about 730 nm to about 1000 nm, or about 750 nm to about 1000 nm.

The organometallic complex may have high thermal stability due to the aforementioned structure. For example, during thermogravimetric analysis (TGA) of the organometallic complex, the temperature at which a weight loss of 5% compared to an initial weight occurs may be greater than or equal to about 300° C., or within the above range, greater than or equal to about 350° C., greater than or equal to about 375° C., greater than or equal to about 400° C., about 300° C. to about 600° C., about 350° C. to about 600° C., about 375° C. to about 600° C., or about 400° C. to about 600° C. Accordingly, when the organometallic complex is applied to a light emitting diode, performance degradation due to thermal decomposition during processing or driving may be prevented.

The organometallic complex may be stable to air and/or moisture and may have solvent resistance such that it is not soluble in any solvent at room temperature.

The organometallic complex may be synthesized by a relatively simple method, for example, by a single step method using an acid solution in an inert atmosphere. The organic ligand of the organometallic complex may be synthesized by, for example, a coupling reaction, and may be synthesized in a relatively easy manner, for example, by a Suzuki coupling reaction.

The aforementioned organometallic complex may be applied to a light emitting diode.

Hereinafter, a light emitting diode according to an embodiment is described.

FIG. 1 is a cross-sectional view showing an example of a light emitting diode according to an embodiment.

Referring to FIG. 1, a light emitting diode 100 according to an embodiment includes a first electrode 110 and a second electrode 120, and a light emitting layer 130 between the first electrode 110 and the second electrode 120, and auxiliary layers 140 and 150 between the first electrode 110 and the light emitting layer 130 and between the second electrode 120 and the light emitting layer 130.

A substrate (not shown) may be disposed under the first electrode 110 or disposed on the second electrode 120. The substrate may be made of, for example, an inorganic material such as glass, an organic material such as polycarbonate, polymethylmethacrylate, polyethyleneterephthalate, polyethylenenaphthalate, polyamide, polyethersulfone, or a combination thereof, or a silicon wafer. The substrate may be omitted.

One of the first electrode 110 and the second electrode 120 is an anode and the other is a cathode. For example, the first electrode 110 may be an anode and the second electrode 120 may be a cathode. For example, the first electrode 110 may be a cathode and the second electrode 120 may be an anode.

At least one of the first electrode 110 and the second electrode 120 may be a light-transmitting electrode. The light-transmitting electrode may be a transparent electrode or a semi-transmissive electrode. The transparent electrode may have light transmittance of greater than or equal to about 85%, greater than or equal to about 90%, or greater than or equal to about 95%, and the transflective electrode may have light transmittance of greater than or equal to about 30% and less than about 85%, about 40% to about 80%, or about 40% to about 75%. The transparent electrode and the semi-transmissive electrode may include, for example, at least one of an oxide conductor, a carbon conductor, or a metal thin film. The oxide conductors may include, for example, one or more of indium tin oxide (ITO), indium zinc oxide (IZO), zinc tin oxide (ZTO), aluminum tin oxide (ATO), and aluminum zinc oxide (AZO), the carbon conductor may include one or more of graphene and carbon nanostructures, and the metal thin film may be a very thin film including aluminum (Al), magnesium (Mg), silver (Ag), gold (Au), magnesium-silver (Mg—Ag), magnesium-aluminum (Mg—Al), an alloy thereof, or a combination thereof.

Any one of the first electrode 110 and the second electrode 120 may be a reflective electrode. The reflective electrode may include a reflective layer having light transmittance of less than about 5% and/or reflectance of greater than or equal to about 80%, and the reflective layer may include an optically opaque material. The optically opaque material may include a metal, a metal nitride, or a combination thereof, for example silver (Ag), copper (Cu), aluminum (Al), gold (Au), titanium (Ti), chromium (Cr), nickel (Ni), an alloy thereof, a nitride thereof (e.g., TiN), or a combination thereof, but is not limited thereto. The reflective electrode may be formed of a reflective layer or may have a stacked structure of a reflective layer/transmissive layer or a transmissive layer/reflective layer/transmissive layer, and the reflective layer may be one layer or two or more layers.

The light emitting layer 130 may include the aforementioned organometallic complex as a light emitter. As described above, the emission spectrum of the organometallic complex in a thin film state may be shifted to a longer wavelength, and accordingly, the peak wavelength of the emission spectrum of the light emitting layer 130 may belong to about 580 nm to about 1200 nm, or within the above range, about 600 nm to 1200 nm, about 620 nm to about 1200 nm, about 650 nm to about 1200 nm, about 680 nm to about 1100 nm, about 700 nm to about 1050 nm, about 710 nm to about 1000 nm, about 730 nm to about 1000 nm, or about 750 nm to about 1000 nm. For example, the light emitting layer 130 may be configured to emit light in a wavelength range of a deep red to near-infrared wavelength spectrum. The descriptions of the organometallic complex are the same as described above.

For example, the aforementioned organometallic complex may be included as a dopant of the light emitting layer 130, and the light emitting layer 130 may further include at least one type of host. The host may be an organic compound, and may include, for example, a low molecular weight compound, a polymer, or a combination thereof. The dopant may be included in an amount of about 0.1 wt % to about 20 wt % based on the total content of the light emitting layer 130, and the host may be included in an amount of about 80 wt % to about 99.9 wt % based on the total content of the light emitting layer 130.

The auxiliary layers 140 and 150 may facilitate injection and/or transport of charges between the first electrode 110 and the light emitting layer 130 and between the second electrode 120 and the light emitting layer 130. The auxiliary layers 140 and 150 may be, for example, a hole injection layer, a hole transport layer, an electron blocking layer, an electron injection layer, an electron transport layer, a hole blocking layer, or a combination thereof, but are not limited thereto. At least one of the auxiliary layers 140 and 150 may be omitted.

The light emitting diode 100 may be used as a light emitting source configured to emit light in a deep red to near-infrared wavelength region by including the aforementioned organometallic complex as a light emitter.

The light emitting diode 100 may be applied to various fields requiring light emission.

For example, the light emitting diode 100 may be included as lighting or a light source in various fields. For example, the light emitting diode 100 may be applied to a thermal infrared device capable of monitoring temperature or night vision requiring light in a near-infrared wavelength spectrum. For example, the light emitting diode 100 may be applied to a skin care device or a medical device that requires light in a near-infrared wavelength spectrum that can effectively penetrate the skin.

For example, the light emitting diode 100 may be included in a display panel. The display panel may include a plurality of subpixels arranged along rows and/or columns, and at least some of the plurality of subpixels may include the aforementioned light emitting diode 100. The display panel may be, for example, an organic light emitting diode display panel, a liquid crystal display panel, or a quantum dot display panel, but is not limited thereto.

For example, the light emitting diode 100 may be included in a sensor.

The sensor may include the light emitting diode 100 as a light emitting source, and may be a biometric sensor, a biosignal sensor, a bioimaging sensor, a security sensor, or a medical sensor, but is not limited thereto. The biometric sensor may be, for example, a fingerprint sensor, an iris sensor, or a distance sensor (e.g., depth sensor or a three-dimensional sensor), and the biosignal sensor may be a photoplethysmography (PPG) sensor, an electroencephalogram (EEG) sensor, an electrocardiogram (ECG) sensor, a blood pressure (BP) sensor, an electromyography (EMG) sensor, a blood glucose (BG) sensor, a motion sensor, or a combination thereof, but they are not limited thereto. The bioimaging sensor may be, for example, a blood vessel imaging sensor, but is not limited thereto.

The aforementioned light emitting diode, lighting, light source, display panel, and/or sensor may be included in various electronic devices. The electronic device may be a display device, a lighting device, a security device, or a medical device, for example a mobile phone, a video phone, a smart phone, a smart pad, a smart watch, a digital camera, a tablet PC, a laptop PC, a notebook computer, a computer monitor, a wearable computer, a television, a digital broadcasting terminal, an e-book, a PDA (Personal Digital Assistant), a PMP (Portable Multimedia Player), an EDA (enterprise digital assistant), a head mounted display (HMD), a vehicle navigation unit, Internet of Things Applicable to devices (IoT), Internet of Things (IoE), a drone, a door lock, a safe, an automated teller machine (ATM), a security device, a skin care mask device, a medical device, an automotive electronic part, etc., but is not limited thereto.

Hereinafter, the embodiments are illustrated in more detail with reference to examples. However, these examples are for illustrative purposes only, and the scope of claims is not limited thereto.

Synthesis Example I: Synthesis of Organic Ligand

Synthesis Example 1

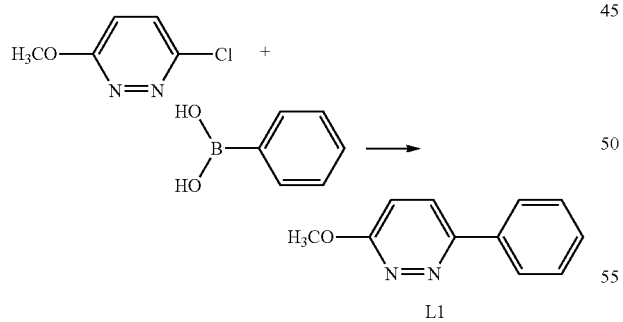

L1

2-methoxy-4-chloropyridazine (1 g, 6.92 mmol, 1 eq.), phenylboronic acid (0.85 g, 6.92 mmol, 1 eq.), Pd(dppf)Cl$_2$ (0.1 g, 0.14 mmol, 0.02 eq.), and K$_2$CO$_3$ (1.91 g, 13.83 mmol, 2 eq.) were put in a flask under a nitrogen atmosphere, and a degassed mixture of toluene, water, and ethanol (60 ml) was added thereto in a volume ratio of 4:1:1. Subsequently, the reaction mixture was stirred under reflux for 24 hours and cooled to room temperature. The obtained mixture was extracted with ethyl acetate (3×100 mL) and washed several times with water. Subsequently, an organic layer was separated therefrom and dried with anhydrous Na$_2$SO$_4$. After removing the solvents under vacuum, the residue was filtered through column chromatography (SiO$_2$, ethyl acetate/n-hexane=1:4 in a volume ratio), obtaining Organic Ligand L1 (1.1 g, 5.9 mmol). A yield thereof was 85%.

$^1$H NMR (CDCl$_3$, 400 MHZ, ppm): δ 7.95 (m, 2H), 7.73 (d, J=9.2 Hz, 1H), 7.45-7.38 (m, 3H), 7.00 (d, J=9.2 Hz, 1H), 4.12 (s, —OCH$_3$, 3H).

Synthesis Example 2

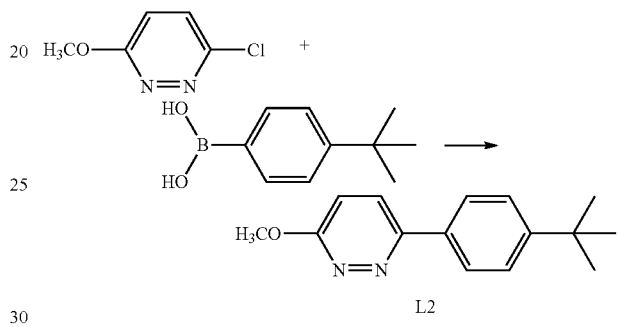

L2

2-methoxy-4-chloropyridazine (1 g, 6.92 mmol, 1 eq.), t-butylphenylboronic acid (1.23 g, 6.92 mmol, 1 eq.), Pd(dppf)Cl$_2$ (0.1 g, 0.14 mmol, 0.02 eq.), and K$_2$CO$_3$ (1.91 g, 13.83 mmol, 2 eq.) were put in a flask under a nitrogen atmosphere, and a degassed mixture of toluene, water, and ethanol (60 ml) in a volume ratio of 4:1:1 was added thereto. Subsequently, the reaction mixture was stirred under reflux for 24 hours and cooled to room temperature. The obtained mixture was extracted with ethyl acetate (3×100 mL) and washed several times with water. Subsequently, an organic layer was separated therefrom and dried with anhydrous Na$_2$SO$_4$. After removing the solvents under vacuum, the residue was filtered through column chromatography (SiO$_2$, ethyl acetate/n-hexane=1:4 as a volume ratio), obtaining Organic Ligand L2 (1.32 g, 5.44 mmol). A yield thereof was 79%.

$^1$H NMR (CDCl$_3$, 400 MHZ, ppm): δ 7.94 (dd, J=6.6, 1.8 Hz, 2H), 7.76 (d, J=9.2, 1.8 Hz, 1H), 7.51 (dd, J=6.6, 1.9 Hz, 2H), 7.02 (d, J=9.2 Hz, 1H), 4.16 (s, —OCH$_3$, 3H), 1.34 (s, —C(CH$_3$)$_3$, 9H).

Synthesis Example 3

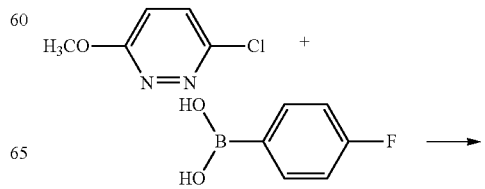

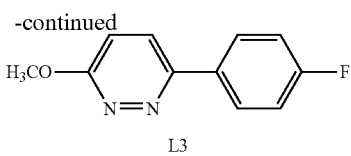

L3

2-methoxy-4-chloropyridazine (1 g, 6.92 mmol, 1 eq.), 4-fluorophenylboronic acid (1.0 g, 6.92 mmol, 1 eq.), Pd(dppf)Cl$_2$ (0.1 g, 0.14 mmol, 0.02 eq.), and K$_2$CO$_3$ (1.91 g, 13.83 mmol, 2 eq.) were put in a flask under a nitrogen atmosphere, and a degassed mixture of toluene, water, and ethanol (60 ml) in a volume ratio of 4:1:1 was added thereto. Subsequently, the reaction mixture was stirred for 24 hours and cooled to room temperature. The obtained mixture was extracted with ethyl acetate (3×100 mL) and washed several times with water. Subsequently, an organic layer was separated therefrom and dried with anhydrous Na$_2$SO$_4$. After removing the solvents under vacuum, the residue was filtered through column chromatography (SiO$_2$, ethyl acetate/n-hexane=1:4 as a volume ratio), obtaining Organic Ligand L3 (1.20 g, 5.87 mmol). A yield thereof was 85%.

$^1$H NMR (DMSO-d$_6$, 400 MHZ, ppm): δ 8.00-7.94 (2, 1H), 7.73 (d, J=9.2 Hz, 1H), 7.18-7.12 (m, 2H), 7.03 (d, J=9.2 Hz, 1H), 4.16 (s, —OCH$_3$, 3H).

Synthesis Example 4

[Reaction Scheme 4]

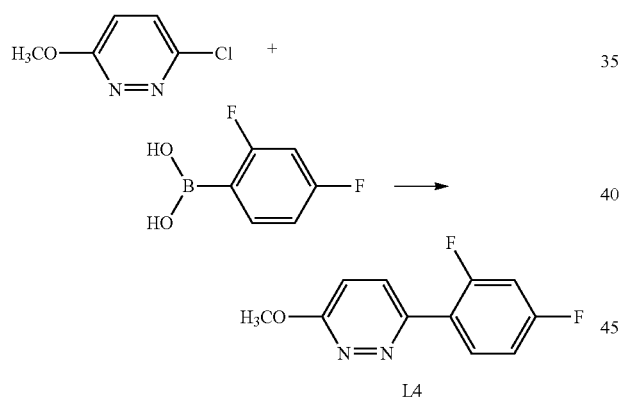

L4

2-methoxy-4-chloropyridazine (1 g, 6.92 mmol, 1 eq.), 2,4-difluorophenylboronic acid (1.1 g, 6.92 mmol, 1 eq.), Pd(dppf)Cl$_2$ (0.1 g, 0.14 mmol, 0.02 eq.), and K$_2$CO$_3$ (1.91 g, 13.83 mmol, 2 eq.) were put in a flask under a nitrogen atmosphere, and a degassed mixture of toluene, water, and ethanol (60 ml, 4:1:1 of a volume ratio) was added thereto. Subsequently, the reaction mixture was stirred for 24 hours and cooled to room temperature. The obtained mixture was extracted with ethyl acetate (3×100 mL) and washed several times with water. Subsequently, an organic layer was separated therefrom and dried with anhydrous Na$_2$SO$_4$. After removing the solvents under vacuum, the residue was filtered through column chromatography (SiO$_2$, ethyl acetate/n-hexane=1:4 as a volume ratio), obtaining Organic Ligand L4 (1.15 g, 5.17 mmol). A yield thereof was 75%.

$^1$H NMR (DMSO-d$_6$, 400 MHZ, ppm): δ 8.13-8.07 (m, 1H), 7.81 (dd, J=9.2, 2.3 Hz, 1H), 7.03-6.98 (m, 2H), 6.93-6.88 (m, 1H), 4.16 (s, —OCH$_3$, 3H).

Synthesis Example 5

[Reaction Scheme 5]

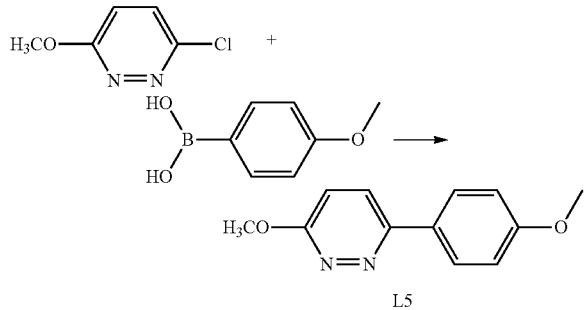

L5

2-methoxy-4-chloropyridazine (1 g, 6.92 mmol, 1 eq.), 4-methoxyphenylboronic acid (1.05 g, 6.92 mmol, 1 eq.), Pd(dppf)Cl$_2$ (0.1 g, 0.14 mmol, 0.02 eq.), and K$_2$CO$_3$ (1.91 g, 13.83 mmol, 2 eq.) were put in a flask under a nitrogen atmosphere, and a degassed mixture of toluene, water, and ethanol (60 ml) in a volume ratio of 4:1:1 was added thereto. Subsequently, the reaction mixture was stirred for 24 hours and cooled to room temperature.

The obtained mixture was extracted with ethyl acetate (3×100 mL) and washed several times with water. Subsequently, an organic layer was separated therefrom and dried with anhydrous Na$_2$SO$_4$. After removing the solvents under vacuum, the residue was filtered through column chromatography (SiO$_2$, ethyl acetate/n-hexane=1:4 as a volume ratio), obtaining Organic Ligand L5 (1.29 g, 5.96 mmol). A yield thereof was 86%.

$^1$H NMR (DMSO-d$_6$, 400 MHz, ppm): δ 7.91-7.87 (m, 2H), 7.67 (d, J=9.2, 2.3 Hz, 1H), 6.95-6.92 (m, 3H), 4.10 (s, —OCH$_3$, 3H), 9.8 (s, —OCH$_3$, 3H).

Synthesis Example 6

[Reaction Scheme 6]

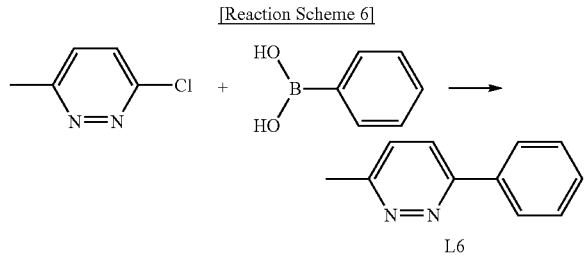

L6

2-methyl-4-chloropyridazine (0.89 g, 6.92 mmol, 1 eq.), 4-methoxyphenylboronic acid (1.05 g, 6.92 mmol, 1 eq.), Pd(dppf)Cl$_2$ (0.1 g, 0.14 mmol, 0.02 eq.), and K$_2$CO$_3$ (1.91 g, 13.83 mmol, 2 eq.) were put in a flask under a nitrogen atmosphere, and a degassed mixture of toluene, water, and ethanol (60 ml, a volume ratio of 4:1:1) was added thereto. Subsequently, the reaction mixture was stirred for 24 hours and cooled to room temperature. The obtained mixture was extracted with ethyl acetate (3×100 mL) and washed several times with water. Subsequently, an organic layer was separated therefrom and dried with anhydrous Na$_2$SO$_4$. After removing the solvents under vacuum, the residue was filtered through column chromatography (SiO$_2$, ethyl acetate/ n-hexane=1:4 as a volume ratio), obtaining Organic Ligand L6 (0.91 g, 5.34 mmol). A yield thereof was 77%.

$^1$H NMR (CDCl$_3$, 400 MHZ, ppm): δ 8.08-8.06 (m, 2H), 7.84 (d, J=8.7 Hz, 1H), 7.57-7.50 (m, 3H), 7.47 (d, J=8.7 Hz, 1H), 2.80 (s, —CH$_3$, 3H).

Synthesis Example 7

[Reaction Scheme 7]

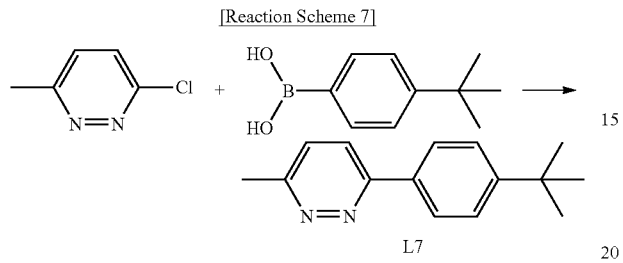

2-methyl-4-chloropyridazine (0.89 g, 6.92 mmol, 1 eq.), t-butylphenylboronic acid (1.23 g, 6.92 mmol, 1 eq.), Pd(dppf)Cl$_2$ (0.1 g, 0.14 mmol, 0.02 eq.), and K$_2$CO$_3$ (1.91 g, 13.83 mmol, 2 eq.) were put in a flask under a nitrogen atmosphere, and a degassed mixture of toluene, water, and ethanol (60 ml, a volume ratio of 4:1:1) was added thereto. Subsequently, the reaction mixture was stirred for 24 hours and cooled to room temperature. The obtained mixture was extracted with ethyl acetate (3×100 mL) and washed several times with water. Subsequently, an organic layer was separated therefrom and dried with anhydrous Na$_2$SO$_4$. After removing the solvents under vacuum, the residue was filtered through column chromatography (SiO$_2$, ethyl acetate/n-hexane=1:4 as a volume ratio), obtaining Organic Ligand L7 (1.2 g, 5.30 mmol). A yield thereof was 77%.

$^1$H NMR (CDCl$_3$, 400 MHZ, ppm): δ 8.04-8.02 (m, 2H), 7.81 (d, J=8.7 Hz, 1H), 7.57-7.55 (m, 2H), 7.43 (d, J=8.8 Hz, 1H), 2.79 (s, —CH$_3$, 3H), 1.39 (s, —C(CH$_3$)$_3$, 9H).

Synthesis Example 8

[Reaction Scheme 8]

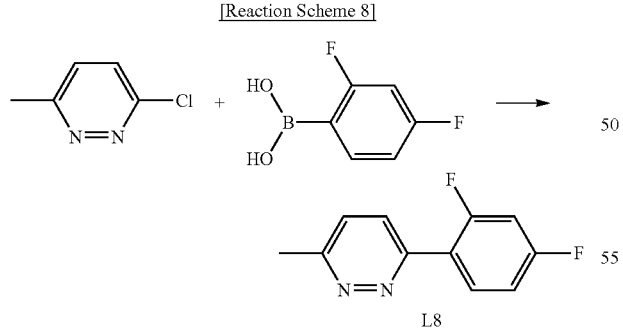

2-methyl-4-chloropyridazine (0.89 g, 6.92 mmol, 1 eq.), 2,4-difluorophenylboronic acid (1.1 g, 6.92 mmol, 1 eq.), Pd(dppf)Cl$_2$ (0.1 g, 0.14 mmol, 0.02 eq.), and K$_2$CO$_3$ (1.91 g, 13.83 mmol, 2 eq.) were put in a flask under a nitrogen atmosphere, and a degassed mixture of toluene, water, and ethanol (60 ml, a volume ratio of 4:1:1) was added thereto. Subsequently, the reaction mixture was stirred for 24 hours and cooled to room temperature. The obtained mixture was extracted with ethyl acetate (3×100 mL) and washed several times with water. Subsequently, an organic layer was separated therefrom and dried with anhydrous Na$_2$SO$_4$. After removing the solvents under vacuum, the residue was filtered through column chromatography (SiO$_2$, ethyl acetate/n-hexane=1:4 of a volume ratio), obtaining Organic Ligand L8 (0.9 g, 4.36 mmol). A yield thereof was 63%.

$^1$H NMR (CDCl$_3$, 400 MHZ, ppm): δ 8.15-8.09 (m, 1H), 7.81 (dd, J=8.7, 2.3 Hz, 1H), 7.33 (d, J=8.8 Hz, 1H), 7.01-6.96 (m, 1H), 6.90-6.84 (m, 1H), 2.70 (s, —CH$_3$, 3H).

Synthesis Example II: Synthesis of Organometallic Complex

Synthesis Example 9

[Reaction Scheme 9]

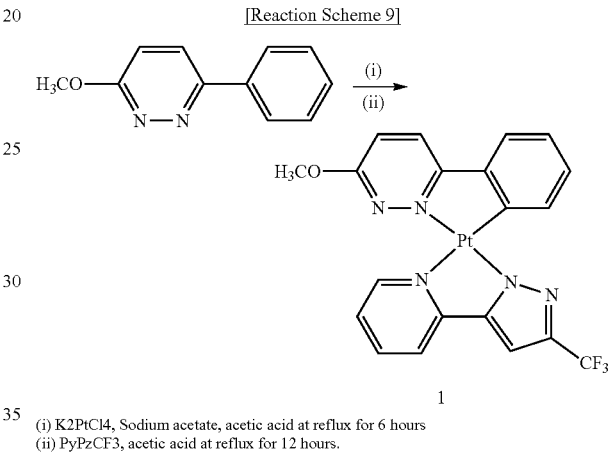

(i) K2PtCl4, Sodium acetate, acetic acid at reflux for 6 hours
(ii) PyPzCF3, acetic acid at reflux for 12 hours.

[PyPzCF$_3$]

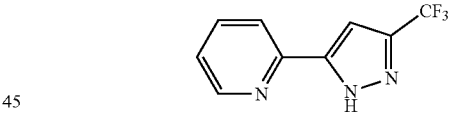

K$_2$PtCl$_4$ (100 mg, 0.24 mmol, 1 eq.), Organic Ligand L1 of Synthesis Example 1 (45 mg, 0.24 mmol, 1 eq.), and NaOAc (790 mg, 9.63 mmol, 40 eq.) were put in a 50 ml flask under a nitrogen atmosphere. Then, degassed acetic acid (15 ml) was added thereto, and the mixed solution was refluxed for 6 hours and cooled to room temperature. Subsequently, the organic ligand PyPzCF$_3$ (52 mg, 0.24 mmol, 1 eq.) was added thereto under a nitrogen atmosphere and then refluxed for 12 hours. When precipitates were formed, the resultant was cooled to room temperature. Subsequently, the precipitates were collected by filtration and washed with water/ethyl acetate/hexane, obtaining yellow Organometallic Complex 1 (92 mg, 0.15 mmol). A yield thereof was 65%.

$^1$H NMR (DMSO-d$_6$, 400 MHZ, ppm): δ 10.19 (d, J=4.9 Hz, 1H), 9.07 (d, J=7.7 Hz, 1H), 8.36 (d, J=9.3 Hz, 1H), 8.14-8.10 (m, 1H), 8.03 (d, J=7.8 Hz, 1H), 7.69-7.67 (m, 2H), 7.63-7.59 (m, J=8.5 Hz, 1H), 7.26-7.22 (m, J=8.5 Hz, 1H), 7.18-7.14 (m, J=8.5 Hz, 2H), 4.25 (s, 3H). $^{19}$F NMR (376 MHZ, DMSO-d$_6$, ppm): δ–54.60 (s, 3F, —CF$_3$).MS (ESI): m/z 615.07, [M$^+$].

Synthesis Example 10

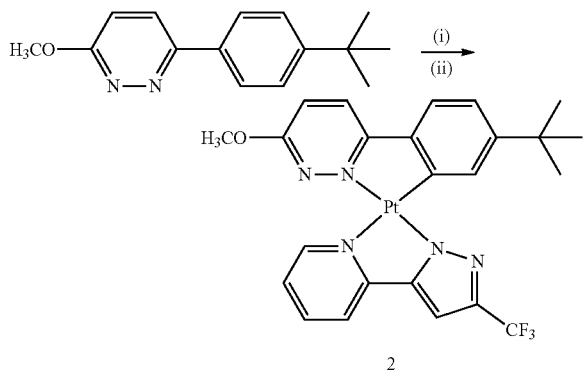

[Reaction Scheme 10]

(i) K2PtCl4, Sodium acetate, acetic acid at reflux for 6 hours
(ii) PyPzCF3, acetic acid at reflux for 12 hours.

K$_2$PtCl$_4$ (100 mg, 0.24 mmol, 1 eq.), Organic Ligand L2 of Synthesis Example 2 (59 mg, 0.24 mmol, 1 eq.), and NaOAc (790 mg, 9.63 mmol, 40 eq.) were put in a 50 ml flask under a nitrogen atmosphere. Then, degassed acetic acid (15 ml) was added thereto, and the mixed solution was refluxed for 6 hours and cooled to room temperature. Subsequently, an organic ligand PyPzCF$_3$ (52 mg, 0.24 mmol, 1 eq.) was added to the mixture under a nitrogen atmosphere and then, refluxed for 12 hours. When precipitates were formed, the resultant was cooled to room temperature. The precipitates were collected by filtration and washed with water/ethyl acetate/hexane, obtaining yellow Organometallic Complex 2 (72 mg, 0.11 mmol). A yield thereof was 46%.

$^1$H NMR (DMSO-d$_6$, 400 MHZ, ppm): δ. 10.19 (d, J=5.6 Hz, 1H), 9.32 (d, J=1.5 Hz, 1H), 8.31 (d, J=9.5 Hz, 1H), 8.14 (t, J=7.5 Hz, 1H), 8.04 (d, J=8.04 Hz, 1H), 7.66-7.60 (m, 2H), 7.57 (t, J=8.5 Hz, 1H), 7.17 (s, 1H), 4.25 (s, 3H), 1.38 (s, 9H). $^{19}$F NMR (376 MHZ, DMSO-d$_6$, ppm): δ-54.97 (s, 3F, —CF$_3$).MS(ESI): m/z 652.1, [M$^+$].

Synthesis Example 11

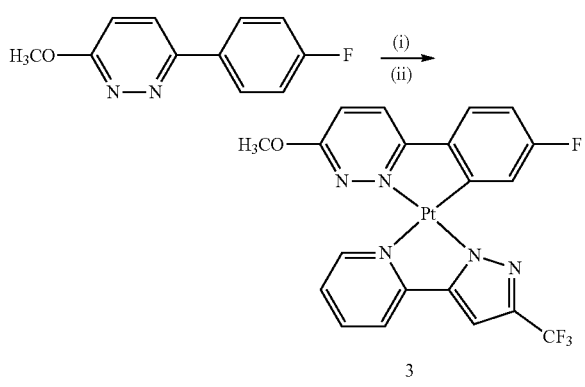

[Reaction Scheme 11]

(i) K2PtCl4, Sodium acetate, acetic acid at reflux for 6 hours
(ii) PyPzCF3, acetic acid at reflux for 12 hours.

K$_2$PtCl$_4$ (100 mg, 0.24 mmol, 1 eq.), Organic Ligand L3 of Synthesis Example 3 (50 mg, 0.24 mmol, 1 eq.), and NaOAc (790 mg, 9.63 mmol, 40 eq.) were put in a 50 ml flask under a nitrogen atmosphere. Then, degassed acetic acid (15 ml) was added thereto, and the mixed solution was refluxed for 6 hours and then cooled to room temperature. Subsequently, an organic ligand PyPzCF$_3$ (52 mg, 0.24 mmol, 1 eq.) was added thereto under a nitrogen atmosphere and then refluxed for 12 hours. When precipitates were formed, the resultant was cooled to room temperature. Subsequently, the precipitates were collected by filtration and washed with water/ethyl acetate/hexane, obtaining yellow Organometallic Complex 3 (85 mg, 0.14 mmol). A yield thereof was 58%.

$^1$H NMR (DMSO-d$_6$, 400 MHZ, ppm): δ. 9.97 (d, J=5.6 Hz, 1H), 8.75 (dd, J=11.3, 2.6 Hz, 1H), 8.13 (d, J=9.4 Hz, 1H), 8.05-8.01 (m, 1H), 7.87 (d, J 5=7.7 Hz, 1H), 7.59-7.56 (m, 1H), 7.54 (d, J=9.2 Hz, 1H), 7.38 (t, J=6.1 Hz, 1H), 7.12 (s, 1H), 6.91-6.86 (m, 1H), 4.14 (S, 3H). $^{19}$F NMR (376 MHZ, DMSO-d$_6$, ppm): δ-59.18 (s, 3F, —CF$_3$), -108.96 (m, 1F). MS(ESI): m/z 652.1, [M$^+$].

Synthesis Example 12

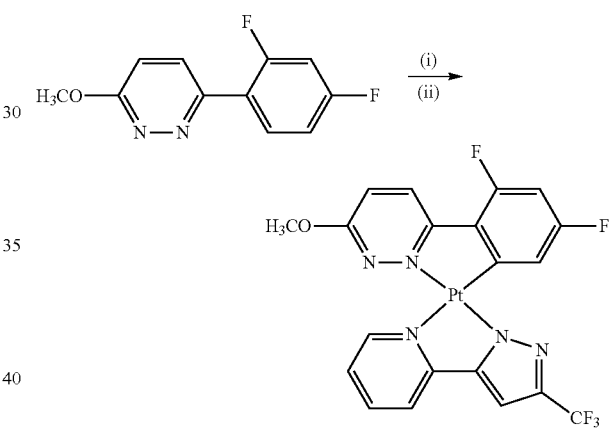

[Reaction Scheme 12]

(i) K2PtCl4, Sodium acetate, acetic acid at reflux for 6 hours
(ii) PyPzCF3, acetic acid at reflux for 12 hours.

K$_2$PtCl$_4$ (100 mg, 0.24 mmol, 1 eq.), Organic Ligand L4 of Synthesis Example 4 (54 mg, 0.24 mmol, 1 eq.), and NaOAc (790 mg, 9.63 mmol, 40 eq.) were put in a 50 ml flask under a nitrogen atmosphere. Then, degassed acetic acid (15 ml) was added thereto, and the mixed solution was refluxed for 6 hours and then cooled to room temperature. Subsequently, an organic ligand PyPzCF$_3$ (52 mg, 0.24 mmol, 1 eq.) was added thereto under a nitrogen atmosphere and then refluxed for 12 hours. When precipitates were formed, the resultant was cooled to room temperature. Subsequently, the precipitates were gathered by filtration and washed with water/ethyl acetate/hexane, obtaining red Organometallic Complex 4 (112 mg, 0.178 mmol). A yield thereof was 74%.

$^1$H NMR (DMSO-d$_6$, 400 MHZ, ppm): δ. 9.91 (d, J=5.16 Hz, 1H), 8.71 (dd, J=10.8, 2.1 Hz, 1H), 8.05-7.98 (m, 2H), 7.85 (d, J=7.92 Hz, 1H), 7.51 (d, J=9.2 Hz, 1H), 7.39 (t, J=5.96 Hz, 1H), 7.03 (s, 1H), 6.76-6.7 (m, 1H), 4.12 (s, 1H). $^{19}$F NMR (376 MHZ, DMSO-d$_6$, ppm): δ-59.54 (s, 3F, —CF$_3$), -106.31 (m, F, —F), -112.97 (m, F, —F).MS(ESI): m/z 631.0, [M$^+$].

Synthesis Example 13

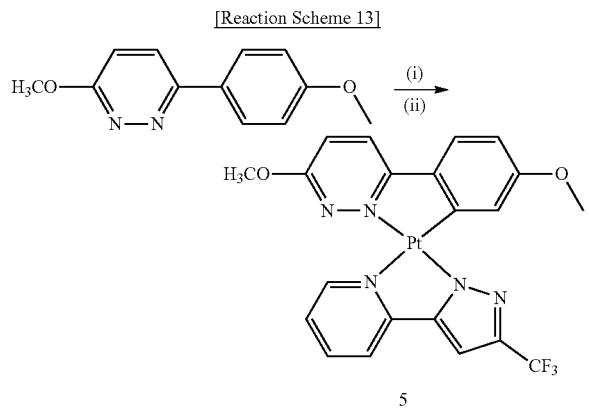

(i) K2PtCl4, Sodium acetate, acetic acid at reflux for 6 hours
(ii) PyPzCF3, acetic acid at reflux for 12 hours.

K$_2$PtCl$_4$ (100 mg, 0.24 mmol, 1 eq.), Organic Ligand L5 of Synthesis Example 5 (52 mg, 0.24 mmol, 1 eq.), and NaOAc (790 mg, 9.63 mmol, 40 eq.)
were put in a 50 ml flask under a nitrogen atmosphere. Then, degassed acetic acid (15 ml) was added thereto, and the mixed solution was refluxed for 6 hours and then cooled to room temperature. Subsequently, an organic ligand PyPzCF$_3$ (52 mg, 0.24 mmol, 1 eq.) was added thereto under a nitrogen atmosphere and then refluxed for 12 hours. Then, when precipitates were formed, it was cooled to room temperature. The precipitates were collected by filtration and washed with water/ethyl acetate/hexane, obtaining yellow Organometallic Complex 5 (47 mg, 0.07 mmol). A yield thereof was 28%.
$^1$H NMR (DMSO-d$_6$, 400 MHZ, ppm): δ. 10.08 (br, 1H), 8.79 (s, 1H), 8.12-8.05 (m, 2H), 7.94 (d, J=8.1 Hz, 1H), 7.52-7.43 (m, 3H), 7.19 (s, 1H), 6.67 (d, J=8.4 Hz, 1H), 4.17 (s, 3H), 3.89 (s, 3H). $^{19}$F NMR (376 MHZ, DMSO-d$_6$, ppm): δ-59.41 (s, 3F, —CF$_3$). MS(ESI): m/z 652.1, [M$^+$].

Synthesis Example 14

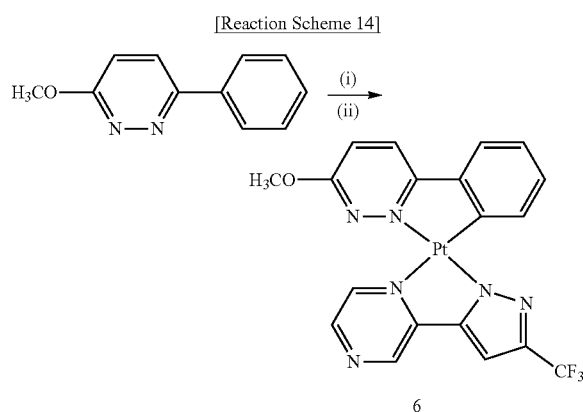

(i) K2PtCl4, Sodium acetate, acetic acid at reflux for 6 hours
(ii) PzPzCF3, acetic acid at reflux for 12 hours.

[PzPzCF$_3$]

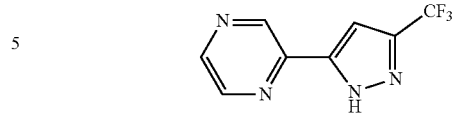

K$_2$PtCl$_4$ (100 mg, 0.24 mmol, 1 eq.), Organic Ligand L1 of Synthesis Example 1 (45 mg, 0.24 mmol, 1 eq.), and NaOAc (790 mg, 9.63 mmol, 40 eq.) were put in a 50 ml flask under a nitrogen atmosphere. Then, degassed acetic acid (15 ml) was added thereto, and the mixed solution was refluxed for 6 hours and then cooled to room temperature. Subsequently, an organic ligand PzPzCF$_3$ (52 mg, 0.24 mmol, 1 eq.) was added thereto under a nitrogen atmosphere and then refluxed for 12 hours. When precipitates were formed, the resultant was cooled to room temperature. The precipitates were collected by filtration and washed with water/ethyl acetate/hexane, obtaining yellow Organometallic Complex 6 (105 mg, 0.18 mmol). A yield thereof was 74%.
$^1$H NMR (DMSO-d$_6$, 400 MHz, ppm): δ. 10.07 (d, J=1.9 Hz, 1H), 9.35 (s, 1H), 8.99 (d, J=7.6 Hz, 1H), 8.85 (d, J=3.1 Hz, 1H), 8.35 (d, J=9.3 Hz, 1H), 7.69-7.65 (m, 2H), 7.33 (s, 1H), 7.27-7.23 (m, 1H), 7.18-7.14 (m, 1H), 4.26 (s, 3H). $^{19}$F NMR (376 MHZ, DMSO-d$_6$, ppm): δ-54.73 (s, 3F, —CF$_3$). MS(ESI): m/z 616.06, [M$^+$].

Synthesis Example 15

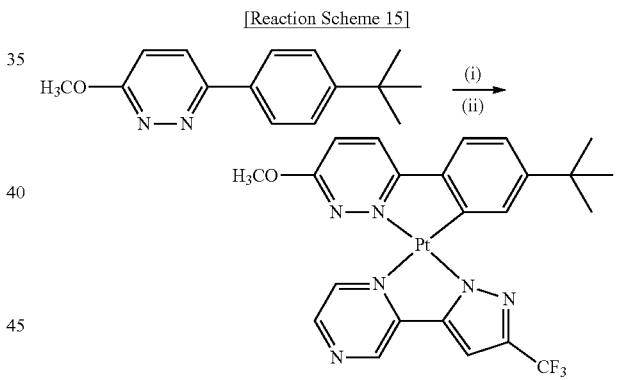

(i) K2PtCl4, Sodium acetate, acetic acid at reflux for 6 hours
(ii) PzPzCF3, acetic acid at reflux for 12 hours.

K$_2$PtCl$_4$ (100 mg, 0.24 mmol, 1 eq.), Organic Ligand L2 of Synthesis Example 2 (59 mg, 0.24 mmol, 1 eq.) and NaOAc (790 mg, 9.63 mmol, 40 eq.) were put in a 50 ml flask under a nitrogen atmosphere. Then, degassed acetic acid (15 ml) was added thereto, and the mixed solution was refluxed for 6 hours and then cooled to room temperature. Subsequently, an organic ligand PzPzCF$_3$ (52 mg, 0.24 mmol, 1 eq.) was added thereto under a nitrogen atmosphere and then refluxed for 12 hours. When precipitates were formed, the resultant was cooled to room temperature. The precipitates were collected by filtration and washed with water/ethyl acetate/hexane, obtaining deep red Organometallic Complex 7 (89 mg, 0.137 mmol). A yield thereof was 57%.
$^1$H NMR (DMSO-d$_6$, 400 MHZ, ppm): δ. 10.07 (s, 1H), 9.35 (s, 1H), 9.24 (s, 1H), 8.84 (s, 1H), 8.29 (d, J=10.2 Hz, 1H), 7.64 (d, J=9.6 Hz, 1H), 7.56 (d, J=8.24 Hz, 1H), 7.32 (s, 1H), 7.19 (d, J=7.9 Hz, 1H), 4.25 (s, 3H), 1.38 (s, 9H). $^{19}$F NMR (376 MHZ, DMSO-$d_6$, ppm): δ−59.86 (s, 3F, —CF$_3$). MS(ESI): m/z 650.9, [M$^+$].

Synthesis Example 16

[Reaction Scheme 16]

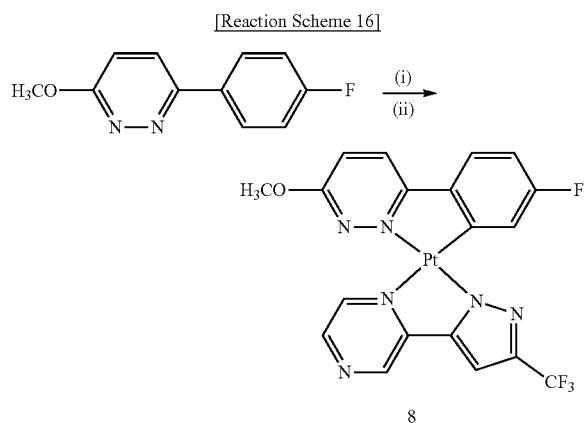

(i) K2PtCl4, Sodium acetate, acetic acid at reflux for 6 hours
(ii) PzPzCF3, acetic acid at reflux for 12 hours.

K$_2$PtCl$_4$ (100 mg, 0.24 mmol, 1 eq.), Organic Ligand L3 of Synthesis Example 3 (50 mg, 0.24 mmol, 1 eq.), and NaOAc (790 mg, 9.63 mmol, 40 eq.) were put in a 50 ml flask under a nitrogen atmosphere. Then, degassed acetic acid (15 ml) was added thereto, and the mixed solution was refluxed for 6 hours and then cooled to room temperature. Subsequently, an organic ligand PzPzCF$_3$ (52 mg, 0.24 mmol, 1 eq.) was added thereto under a nitrogen atmosphere and then refluxed for 12 hours. Then, when precipitates were formed, the resultant was cooled to room temperature. Subsequently, precipitates were collected by filtration and washed with water/ethyl acetate/hexane, obtaining bluish green Organometallic Complex 8 (115 mg, 0.183 mmol). A yield thereof was 76%.

$^1$H NMR (DMSO-$d_6$, 400 MHz, ppm): δ. 9.72 (s, 1H), 9.14 (s, 1H), 8.61 (s, 1H), 8.55 (d, J=9.92 Hz, 1H), 7.98 (s, 1H), 7.51 (d, J=9.08 Hz, 1H), 7.13 (s, 1H), 6.76 (t, J=9.86 Hz, 1H), 4.13 (s, 3H). $^{19}$F NMR (376 MHZ, DMSO-$d_6$, ppm): δ−54.93 (s, 3F, —CF$_3$), −101.07 (m, F, —F), −107.83 (m, F, —F).MS(ESI): m/z 637.9, [M$^+$].

Synthesis Example 17

[Reaction Scheme 17]

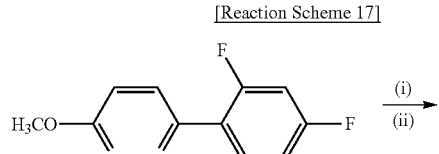

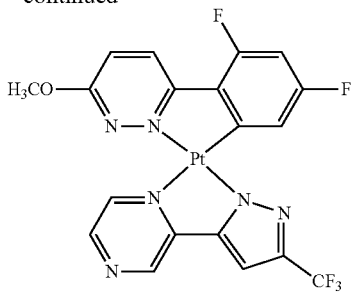

(i) K2PtCl4, Sodium acetate, acetic acid at reflux for 6 hours
(ii) PzPzCF3, acetic acid at reflux for 12 hours.

K$_2$PtCl$_4$ (100 mg, 0.24 mmol, 1 eq.), Organic Ligand L4 of Synthesis Example 4 (54 mg, 0.24 mmol, 1 eq.), and NaOAc (790 mg, 9.63 mmol, 40 eq.) were put in a 50 ml flask under a nitrogen atmosphere. Then, degassed acetic acid (15 ml) was added thereto, and the mixed solution was refluxed for 6 hours and then cooled to room temperature. Subsequently, an organic ligand PzPzCF$_3$ (52 mg, 0.24 mmol, 1 eq.) was added to the mixture in a nitrogen atmosphere and refluxed for 12 hours. Then, when precipitates were formed, the resultant was cooled to room temperature. Subsequently, the precipitates were collected by filtration and washed with water/ethyl acetate/hexane, obtaining bluish green Organometallic Complex 9 (109 mg, 0.178 mmol). A yield thereof was 74%.

$^1$H NMR (DMSO-$d_6$, 400 MHZ, ppm): δ. 9.91 (d, J=5.16 Hz, 1H), 8.71 (dd, J=10.8, 2.1 Hz, 1H), 8.05-7.98 (m, 2H), 7.85 (d, J=7.92 Hz, 1H), 7.51 (d, J=9.2 Hz, 1H), 7.39 (t, J=5.96 Hz, 1H), 7.03 (s, 1H), 6.76-6.7 (m, 1H), 4.12 (s, 1H). $^{19}$F NMR (376 MHZ, DMSO-$d_6$, ppm): δ−59.54 (s, 3F, —CF$_3$), −106.31 (m, F, —F), −112.97 (m, F, —F). MS(ESI): m/z 631.0, [M$^+$].

Synthesis Example 18

[Reaction Scheme 18]

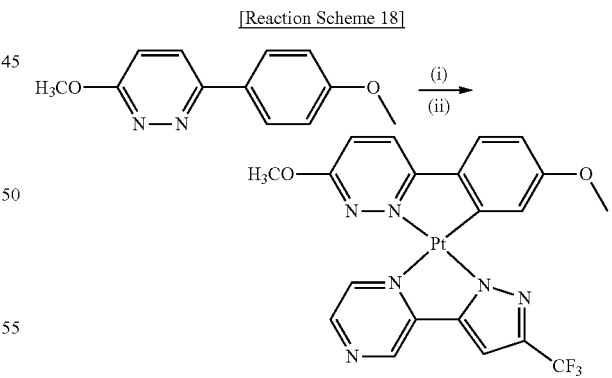

(i) K2PtCl4, Sodium acetate, acetic acid at reflux for 6 hours
(ii) PzPzCF3, acetic acid at reflux for 12 hours.

K$_2$PtCl$_4$ (100 mg, 0.24 mmol, 1 eq.), Organic Ligand L5 of Synthesis Example 5 (52 mg, 0.24 mmol, 1 eq.), and NaOAc (790 mg, 9.63 mmol, 40 eq.) were put in a 50 ml flask under a nitrogen atmosphere. Then, degassed acetic acid (15 ml) was added thereto, and the mixed solution was refluxed for 6 hours and then cooled to room temperature.

Subsequently, an organic ligand PzPzCF$_3$ (52 mg, 0.24 mmol, 1 eq.) was added thereto under a nitrogen atmosphere and then refluxed for 12 hours. When precipitates were formed, the resultant was cooled to room temperature. The precipitates were collected by filtration and washed with water/ethyl acetate/hexane, obtaining bluish green Organometallic Complex 10 (75 mg, 0.12 mmol). A yield thereof was 50%.

$^1$H NMR (DMSO-d$_6$, 600 MHz, ppm): δ. 9.95 (d, J=1.5 Hz, 1H), 9.25 (s, 1H), 8.74-8.69 (m, 2H), 8.10 (d, J=9.2 Hz, 1H), 7.51 (d, J=9.2 Hz, 1H), 7.48 (d, J=8.3 Hz, 1H), 7.25 (s, 1H), 6.67-6.65 (m, 1H), 4.18 (s, —OCH$_3$, 3H), 3.89 (s, —OCH$_3$, 3H). $^{19}$F NMR (565 MHZ, DMSO-d$_6$, ppm): δ−59.68 (s, 3F, —CF$_3$).

Synthesis Example 19

[Reaction Scheme 19]

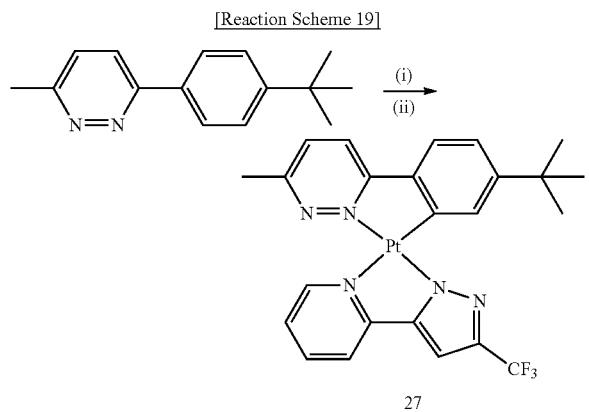

(i) K$_2$PtCl$_4$, Sodium acetate, acetic acid at reflux for 6 hours
(ii) PyPzCF$_3$, acetic acid at reflux for 12 hours K$_2$PtCl$_4$ (100 mg, 0.24 mmol, 1 eq.), Organic Ligand L7 of Synthesis Example 7 (54 mg, 0.24 mmol, 1 eq.), and NaOAc (790 mg, 9.63 mmol, 40 eq.) were put in a 50 ml flask under a nitrogen atmosphere. Then, degassed acetic acid (15 ml) was added thereto, and the mixed solution was refluxed for 6 hours and then, cooled to room temperature. Subsequently, an organic ligand PzPzCF$_3$ (52 mg, 0.24 mmol, 1 eq.) was added thereto under a nitrogen atmosphere and then refluxed for 12 hours. When precipitates were formed, the resultant was cooled to room temperature. The precipitates were collected by filtration and washed with water/ethyl acetate/hexane, obtaining bluish green Organometallic Complex 27 (72 mg, 0.11 mmol). A yield thereof was 47%.

$^1$H NMR (DMSO-d$_6$, 600 MHz, ppm): δ. 10.16 (d, J=5.3 Hz, 1H), 9.38 (s, 1H), 8.32 (d, J=8.7 Hz, 1H), 8.17 (t, 1H), 8.08 (d, J=7.3 Hz, 1H), 7.99 (d, J=8.6 Hz, 1H), 7.68-7.66 (m, 2H), 7.24 (m, 2H), 2.81 (s, 3H), 1.42 (s, 9H). 19F NMR (565 MHZ, DMSO-d$_6$, ppm): δ−59.66 (s, 3F, —CF$_3$).

Synthesis Example 20

[Reaction Scheme 20]

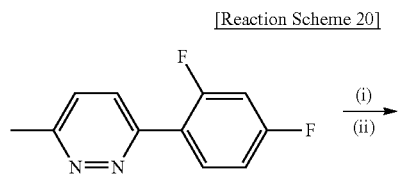

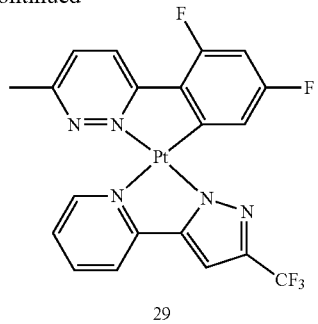

(i) K$_2$PtCl$_4$, Sodium acetate, acetic acid at reflux for 6 hours
(ii) PyPzCF$_3$, acetic acid at reflux for 12 hours K$_2$PtCl$_4$ (100 mg, 0.24 mmol, 1 eq.), Organic Ligand L8 of Synthesis Example 8 (50 mg, 0.24 mmol, 1 eq.), and NaOAc (790 mg, 9.63 mmol, 40 eq.) were put in a 50 ml flask under a nitrogen atmosphere. Then, degassed acetic acid (15 ml) was added thereto, and the mixed solution was refluxed for 6 hours and then cooled to room temperature. Subsequently, an organic ligand PzPzCF$_3$ (52 mg, 0.24 mmol, 1 eq.) was added thereto under a nitrogen atmosphere and then refluxed for 12 hours. When precipitates were formed, the resultant was cooled to room temperature. The precipitates were collected by filtration and washed with water/ethyl acetate/hexane, obtaining bluish green Organometallic Complex 29 (50 mg, 0.82 mmol). A yield thereof was 34%.

$^1$H NMR (DMSO-d$_6$, 600 MHZ, ppm): δ. 10.04 (d, J=5.5 Hz, 1H), 8.88 (d, J=10.5 Hz, 1H), 8.26 (d, J=8.9 Hz, 1H), 8.16 (t, 1H), 8.04 (t, 1H), 7.64 (t, 1H), 7.21 (s, 1H), 6.95 (t, 1H), 2.81 (s, —CH$_3$, 1H). $^{19}$F NMR (565 MHZ, DMSO-d$_6$, ppm): δ−59.48 (s, 3F, —CF$_3$), −105.41 (m, —F), −111.76 (m, —F).

Evaluation I

The organometallic complexes according to Synthesis Examples were examined with respect to structures.

The structures of the organometallic complexes was confirmed at a temperature of 223 K by using a graphite monochromator (Mo K$_\alpha$ radiation, λ=0.71073 Å) monocrystalline X-ray diffractometer (Bruker APEX III λ-CCD, Bruker), and then the obtained image data were integrated through SAINT-Plus, and absorption effects due to Lorentz factor, polarization, scan rate, and air were corrected by a multi-scan method (SADABS). The crystal structures thereof were analyzed by using SHELXS-97 and refined by using SHELXL (2018-3).

Figure 2:
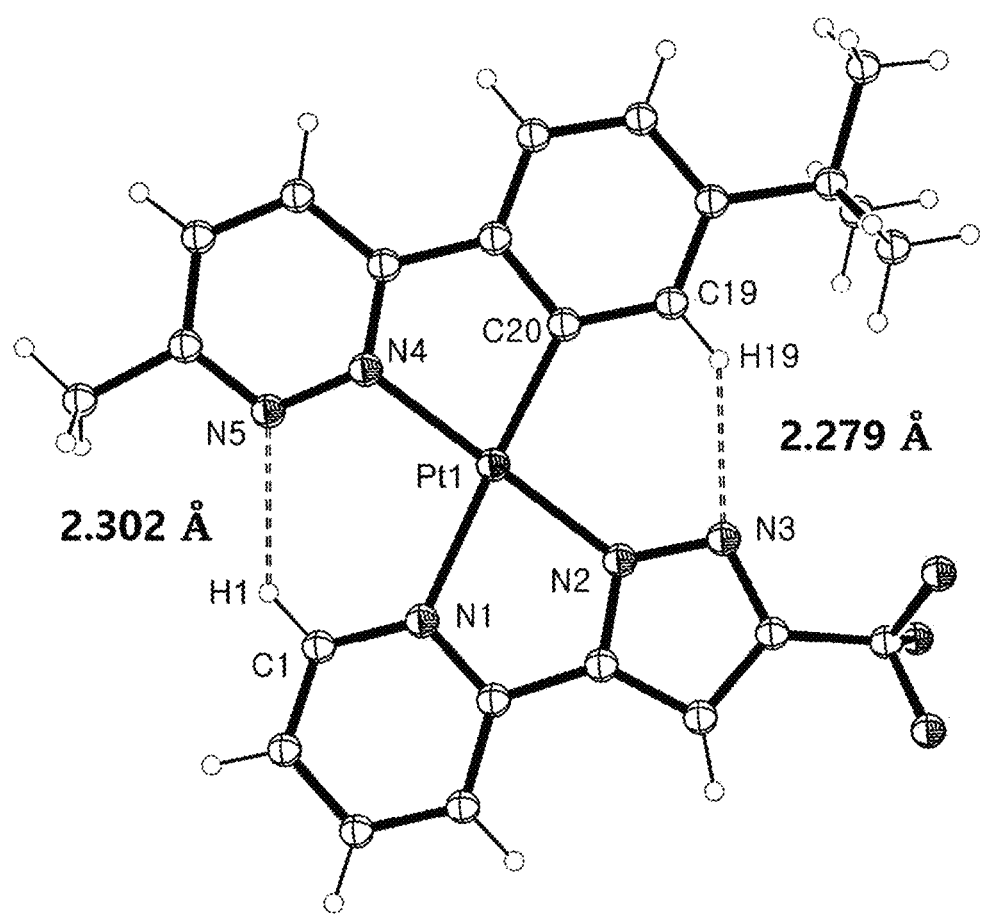
FIG. 2 is a plan view showing the single crystal X-ray structure of the organometallic complex obtained in Synthesis Example 19.
Figure 3:
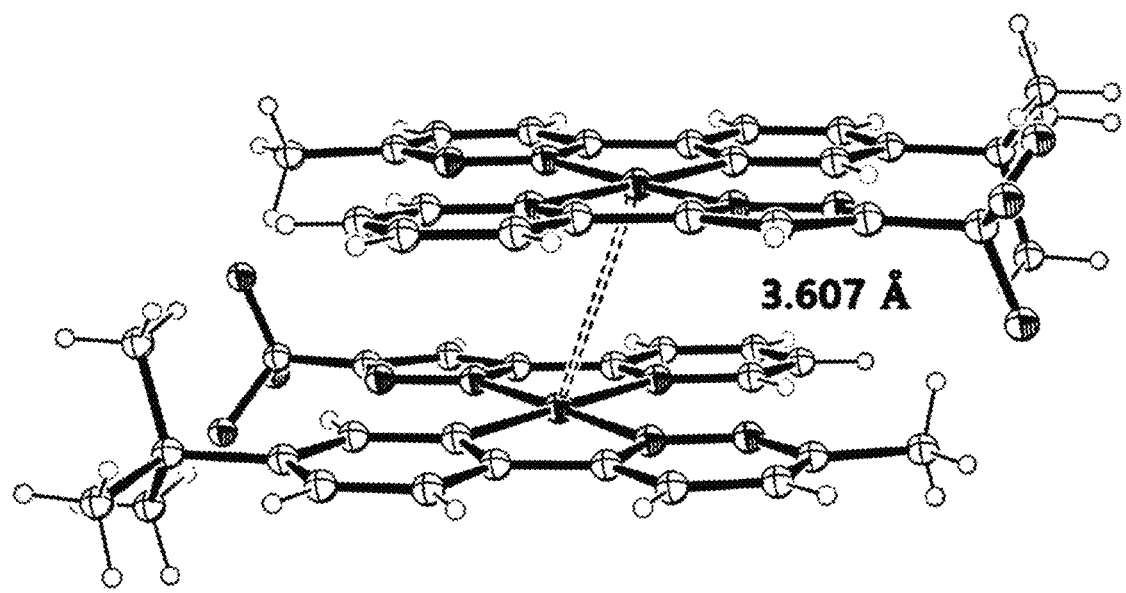
FIG. 3 is a cross-sectional view showing a single crystal X-ray structure of the organometallic complex obtained in Synthesis Example 19.

FIG. 2 is a top plan view showing the monocrystalline X-ray structure of the organometallic complex according to Synthesis Example 19, and FIG. 3 is a cross-sectional view showing the monocrystalline X-ray structure of the organometallic complex according to Synthesis Example 19.

In FIGS. 2 and 3, referring to a distance between transition metal ions of the organometallic complex and an intramolecular hydrogen bond length, the organometallic complex of Synthesis Example 19 turned out to have a substantially perfect square planar structure (PSP).

Evaluation II

Heat resistance properties of the organometallic complexes according to Synthesis Examples were evaluated.

The heat resistance properties of a sample were evaluated through thermogravimetric analysis (TGA) by increasing a temperature under a high vacuum of less than or equal to 10

Pa and obtaining a temperature Tas where a weight of the sample decreased by 5% from the initial weight.

The results are shown in Table 1.

TABLE 1

| Organometallic Complex No. | $T_{d5}$ (° C.) |
|---|---|
| 1 | 361 |
| 2 | 385 |
| 3 | 370 |
| 4 | 358 |
| 5 | 354 |
| 6 | 363 |
| 7 | 367 |
| 8 | 360 |
| 9 | 384 |
| 10 | 335 |

* $T_{d5}$: a temperature at which the sample weight decreases by 5% compared to the initial weight Evaluation III Luminescence properties of the organometallic complexes according to Synthesis Examples were evaluated.

The luminescence properties were evaluated by comparing luminescence of the organometallic complexes in a solution and luminescence of the organometallic complexes in powder form.

The organometallic complex in a solution was evaluated by obtaining a PL emission spectrum and an absolute quantum yield after dissolving the organometallic complexes of Synthesis Examples in dichloromethane ($CH_2Cl_2$) at a concentration of $2\times10^{-5}$ M at room temperature and purging the solution under a nitrogen atmosphere at room temperature to suppress quenching effects due to oxygen. Herein, in order to remove data noise caused by the dichloromethane used as a solvent, a quartz holder containing the dichloromethane solvent alone was used as a reference solvent.

The organometallic complex in powder form was processed in the same manner as above by putting a sample in powder-only quartz at room temperature. The PL characteristics were evaluated by using an absolute quantum yield-measuring equipment equipped with a 3.3-inch integrating sphere (Quantaurus-QY C11347-11, Hamamatsu Photonics, JAPAN), and a fluorescent spectrometer (F-7000, Hitachi, JAPAN) was used to cross-verify the luminescence properties and obtain a precise profile.

The results are shown in Table 2.

TABLE 2

| Organometallic Complex No. | $\lambda_{e,solution}$ (nm) | $\lambda_{e,powder}$ (nm) |
|---|---|---|
| 1 | 588 | 629 |
| 3 | 582 | 626 |
| 4 | 578 | 637 |
| 5 | 611 | 680 |
| 6 | 588 | 670 |
| 7 | 598 | 670 |
| 8 | 583 | 783 |
| 9 | 577 | 776 |
| 10 | 585 | 670 |

* $\lambda_{e,solution}$: the peak wavelength of the emission spectrum of the organometallic complex in a solution
* $\lambda_{e,powder}$: the peak wavelength of the emission spectrum of the organometallic complex in a powder form Referring to Table 2, a peak wavelength of an emission spectrum of the organometallic complex in a solid state (powder form) shifted toward a longer wavelength, compared with that of an emission spectrum of the organometallic complex in a solution. The reason is that in the organometallic complex in the solid state (powder form), an intermolecular hydrogen bond in addition to an interaction (M-M) between central metals of adjacent molecules and an intramolecular hydrogen bond was additionally formed and thus expected to affect luminescence energy.

Evaluation IV

Electrical characteristics of the organometallic complexes according to Synthesis Examples were evaluated.

The electrical characteristics were obtained from HOMO and LUMO by a density functional theory (DFT), and a compound structure was optimized by using B3LYP (Becke, 3-parameter, Lee-Yang-Parr) hybrid function, a 6-31G** basis set for constituent atoms excluding a transition element M, and ECP (effective core potential) to consider relative effects of the transition element M. The calculation was performed by using Schrödinger's Jaguar (2020-3).

The results are shown in Table 3.

TABLE 3

| Organometallic Complex No. | HOMO (eV) | LUMO (eV) |
|---|---|---|
| 1 | −5.67 | −2.33 |
| 2 | −5.60 | −2.27 |
| 3 | −5.76 | −2.38 |
| 4 | −5.89 | −2.43 |
| 5 | −5.47 | −2.19 |
| 6 | −5.86 | −2.53 |
| 7 | −5.78 | −2.47 |
| 8 | −5.94 | −2.58 |
| 9 | −6.08 | −2.64 |
| 10 | −5.63 | −2.39 |

Example: Manufacture of Organic Light Emitting Diode

Example 1

Indium tin oxide (ITO) was sputtered on a glass substrate to form a lower electrode deposited on half of a total area of the glass substrate. On the lower electrode, 4,4'-cyclohexylidenebis [N, N-bis(4-methylphenyl)benzenamine] (TAPC) (hole injection layer (HIL)), 4,4',4''-tris(carbazol-9-yl)-triphenylamine (TCTA) (hole transport layer (HTL)), the organometallic complex of Synthesis Example 9 (light emitting layer), 4,6-bis(3,5-di(pyridin-3-yl)phenyl)-2-methylpyrimidine (B3PYMPM) (electron transport layer (ETL)), lithium fluoride (LiF) (electron injection layer (EIL)), and aluminum (Al) (upper electrode) were sequentially deposited to be less than or equal to 1 A/s by thermal evaporation under a high vacuum ($1.0\times10^{-6}$ torr or less), manufacturing an organic light emitting diode. Herein, each layer had a thickness of 150 nm (lower electrode), nm (hole injection layer (HIL)), 10 nm (hole transport layer (HTL)), 25 nm (light emitting layer), 80 nm (electron transport layer (ETL)), 1 nm (electron injection layer (EIL)), and 100 nm (upper electrode).

Example 2

An organic light emitting diode was manufactured in the same manner as Example 1 except that the organometallic complex of Synthesis Example 12 was used instead of the organometallic complex of Synthesis Example 9 to form a light emitting layer.

Example 3

An organic light emitting diode was manufactured in the same manner as Example 1 except that the organometallic complex of Synthesis Example 14 was used instead of the organometallic complex of Synthesis Example 9 to form a light emitting layer.

Example 4

An organic light emitting diode was manufactured in the same manner as Example 1 except that the organometallic complex of Synthesis Example 17 was used instead of the organometallic complex of Synthesis Example 9 to form a light emitting layer.

Evaluation V

Light emitting characteristics of the organic light emitting diodes according to Examples were evaluated.

The light emitting characteristics were evaluated by a luminance and emission spectrum of an organic light emitting diode.

Current density (J), voltage (V), luminance radiance (R), and electroluminescence by each angle (EL) of the organic light emitting diode were measured by using a calibrated photodiode (FDS100, Thorlab) fixed to a motorized goniometer (PRM1/MZ8, Thorlabs), a spectrometer (BW_UVNb, StellarNet), and a source-measuring device (Keithley 2400, Keithley) inside a black box. Herein, the measurement was carried out in a glove box filled with nitrogen ($N_2$) gas, and the characteristics of the organic light emitting diode were evaluated by measuring all angles rather than Lambertian simplification.

The results are shown in Table 4.

TABLE 4

| Example No. | Max. Radiance (W/m$^2$/sr) | $\lambda_{peak}$ (nm) |
| --- | --- | --- |
| 1 | 34.8 | 741 |
| 2 | 13.2 | 788 |
| 3 | 15.1 | 847 |
| 4 | 15.6 | 838 |

Referring to Table 4, the organic light emitting diodes of Examples exhibited a peak wavelength in a near-infrared wavelength spectrum of about 700 nm or more, from which the organometallic complex was expected to be used as a near-infrared light emitting diode.

Evaluation VI

Electrical characteristics of the organic light emitting diodes according to Examples were evaluated.

The electrical characteristics of the organic light emitting diodes were evaluated from external quantum efficiency (EQE) in the following method. Current density (J), voltage (V), radiance (R), and electro-luminescence for each angle (EL) characteristic of the light emitting diodes were measured by using a calibrated photodiode (FDS100, Thorlab) fixed to a motorized goniometer (PRM1/MZ8, Thorlabs), a spectrometer (BW_UVNb, StellarNet), and a source-measuring device (Keithley 2400, Keithley) inside a black box. Herein, the measurement was carried out in a glove box filled with nitrogen ($N_2$) gas, and the characteristics of the organic light emitting diode were evaluated by measuring all angles rather than Lambertian simplification. Based on the measured results, the external quantum efficiency was evaluated by the following definition of the external quantum efficiency (EQE).

$$\eta_{EQE} = \frac{\Phi^{total}}{hc/\lambda} \bigg/ \frac{I}{e} = \frac{e \int_\lambda \int_\Omega \lambda I_R(\lambda, \Omega) d\lambda d\Omega}{Ihc}$$

$\Phi^{total}$: total radiant flux
h: Planck constant
c: speed of light
λ: wavelength
I: current
e: elementary charge
Ω: solid angle
$I_R$: Radiant intensity The results are shown in Table 5.

TABLE 5

| Example No. | EQE (@ $\lambda_{peak}$) (%) |
| --- | --- |
| 1 | 5.1 |
| 2 | 3.2 |
| 3 | 2.4 |
| 4 | 4.6 |

Referring to Table 5, the organic light emitting diodes of Examples exhibited satisfactory external quantum efficiency at a light emitting peak wavelength.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. An organometallic complex represented by Chemical Formula 1:

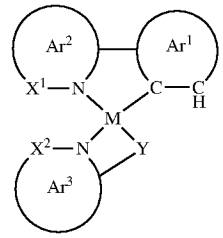

[Chemical Formula 1]

wherein, in Chemical Formula 1,
M is a transition metal,
Ar$^1$ is a substituted or unsubstituted C6 to C20 arylene group,
Ar$^2$ and Ar$^3$ are different from each other and are each independently a heterocyclic group including at least one nitrogen,
one of X$^1$ and X$^2$ is N and the other of X$^1$ and X$^2$ is CH, and
Y is a heterocyclic group including at least one nitrogen or —OC(=O)—,
provided that when X$^1$ is N and X$^2$ is CH, Ar$^2$ is a substituted or unsubstituted pyridazinylene, and Ar$^3$ is a substituted or unsubstituted pyridinylene group or a substituted or unsubstituted pyrazinylene group, or
provided that when X$^1$ is CH and X$^2$ is N, Ar$^2$ is a substituted or unsubstituted pyridinylene group or a substituted or unsubstituted pyrazinylene group, and Ar$^3$ is a substituted or unsubstituted pyridazinylene.

2. The organometallic complex of claim 1, wherein Ar$^1$ is a substituted or unsubstituted phenylene group.

3. The organometallic complex of claim 1, wherein Y is a substituted or unsubstituted pyrazolylene group.

4. The organometallic complex of claim 1, wherein M is Pt, Pd, Ni, Ir, Rh, Mn, Fe, Co, Cu, or Cr.

5. The organometallic complex of claim 1, wherein the organometallic complex represented by Chemical Formula 1 is represented by Chemical Formula 1A or 1B:

[Chemical Formula 1A]

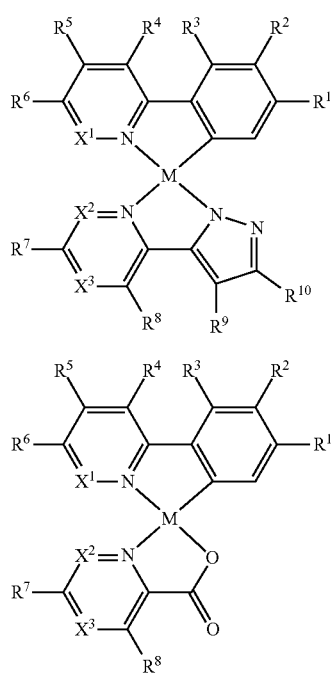

[Chemical Formula 1B]

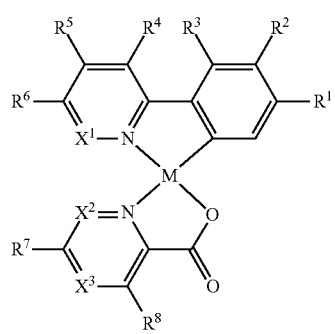

wherein, in Chemical Formula 1A or 1B,

M is a transition metal, one of $X^1$ and $X^2$ is N and the other of $X^1$ and $X^2$ is CH, and $X^3$ is N or $CR^a$, and $R^1$ to $R^{10}$ and $R^a$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a halogen, a cyano group, or a combination thereof.

6. The organometallic complex of claim 5, wherein at least two of $R^1$ to $R^{10}$ and $R^a$ are a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a halogen, a cyano group, or a combination thereof.

7. The organometallic complex of claim 5, wherein at least one of $R^1$ to $R^3$ is a substituted or unsubstituted C3 to C30 branched alkyl group, a substituted or unsubstituted C1 to C30 alkoxy group, a halogen, a C1 to C30 haloalkyl group, or a combination thereof, and at least one of $R^4$ to $R^6$ is a substituted or unsubstituted C1 to C30 alkyl group, a substituted or unsubstituted C1 to C30 alkoxy group, or a combination thereof.

8. The organometallic complex of claim 5, wherein the compound represented by Chemical Formula 1A is represented by Chemical Formula 1AA or 1AB, and the compound represented by Chemical Formula 1B is represented by Chemical Formula 1BA or 1BB:

[Chemical Formula 1AA]

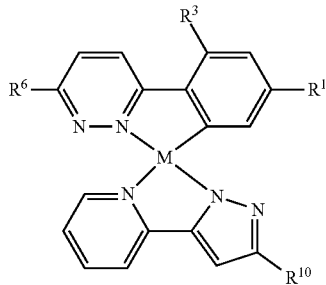

[Chemical Formula 1AB]

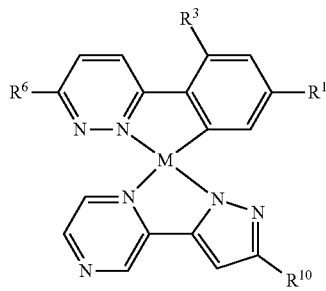

[Chemical Formula 1BA]

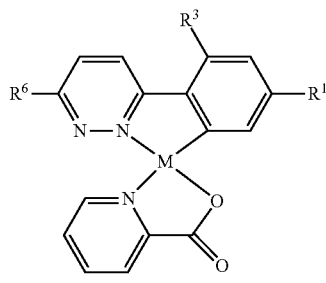

[Chemical Formula 1BB]

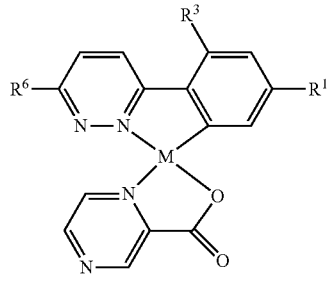

wherein, in Chemical Formula 1AA, 1AB, 1BA, or 1BB, $R^1$, $R^3$, $R^6$, and $R^{10}$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a halogen, a cyano group, or a combination thereof.

9. The organometallic complex of claim 8, wherein $R^1$ is hydrogen, a substituted or unsubstituted C3 to C30 branched alkyl group, a substituted or unsubstituted C1 to C30 alkoxy group, a halogen, a C1 to C30 haloalkyl group, or a combination thereof, R[6] is a substituted or unsubstituted C1 to C30 linear alkyl group, a substituted or unsubstituted C3 to C30 branched alkyl group, a substituted or unsubstituted C1 to C30 alkoxy group, or a combination thereof, and R[10] is a phenyl group, a naphthyl group, an anthracenyl group, a halogen, a C1 to C30 haloalkyl group, C6 to C30 haloaryl group, a substituted or unsubstituted pyridinyl group, a substituted or unsubstituted pyrimidinyl group, a substituted or unsubstituted triazinyl group, or a combination thereof.

10. The organometallic complex of claim 1, wherein the organometallic complex is one of the compounds listed in Group 3:

[Group 3]

1
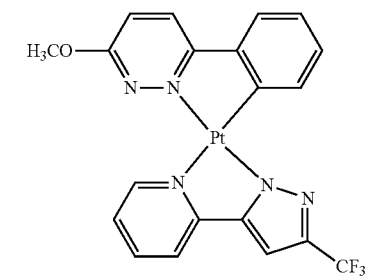

2
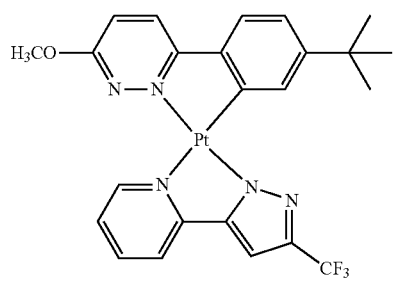

3
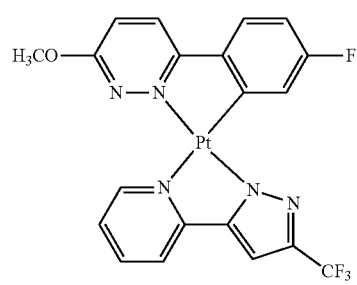

4
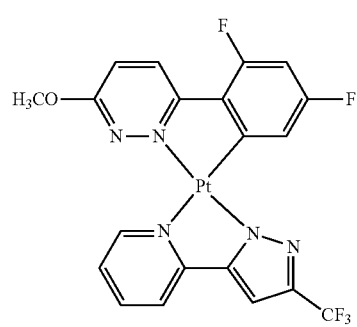

-continued

5
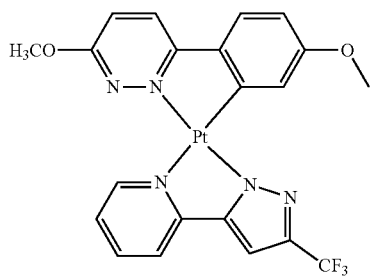

6
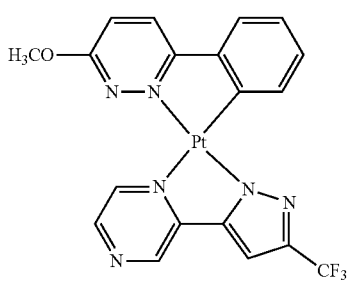

7
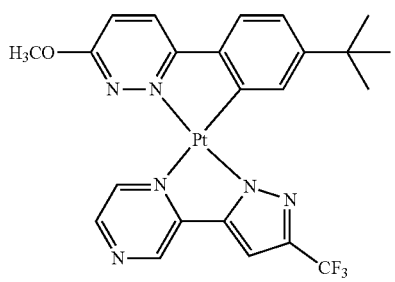

8
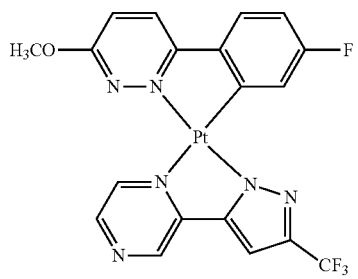

9
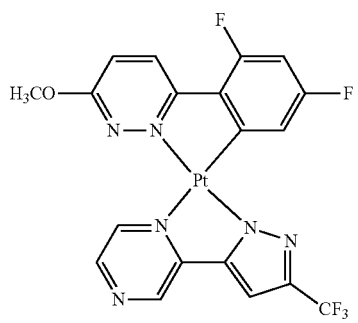

10
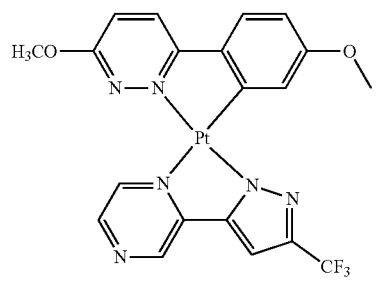
11
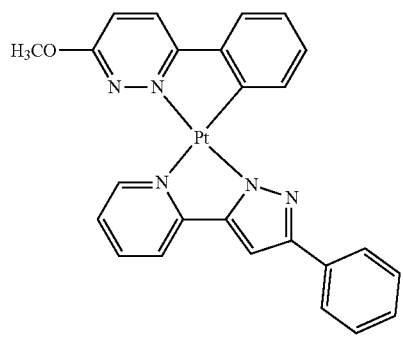
12
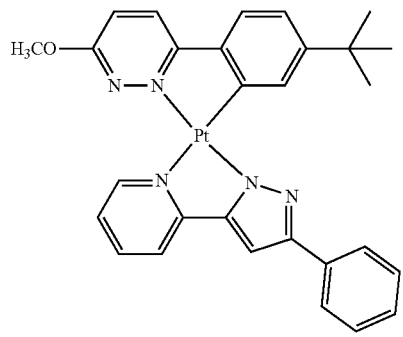
13
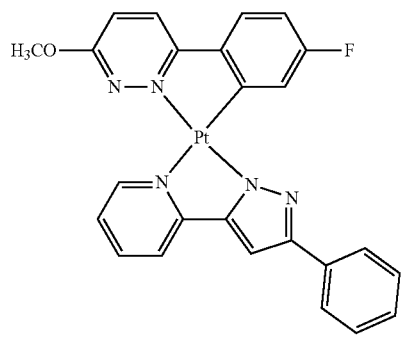
14
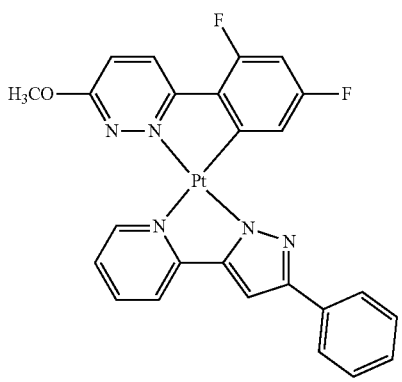
15
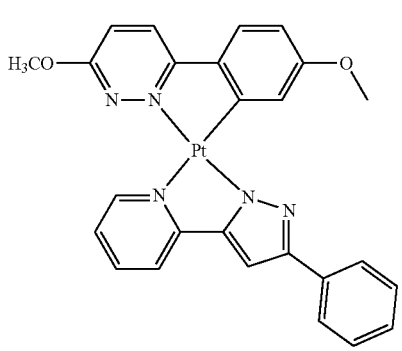
16
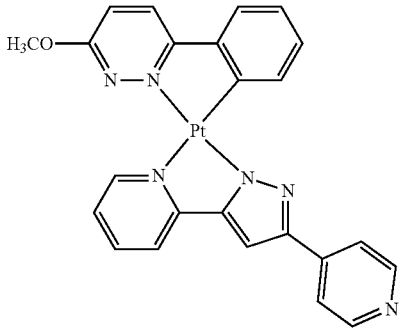
17
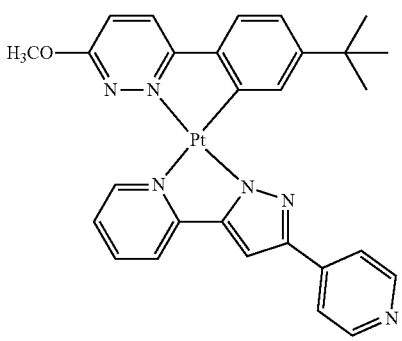

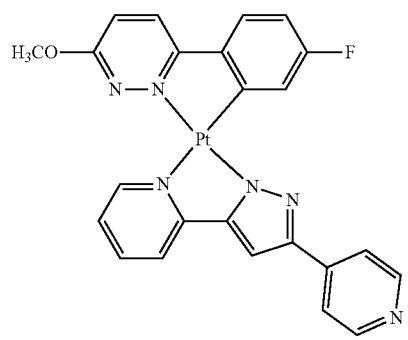
18
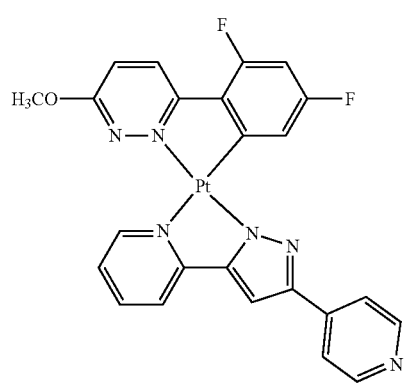
19
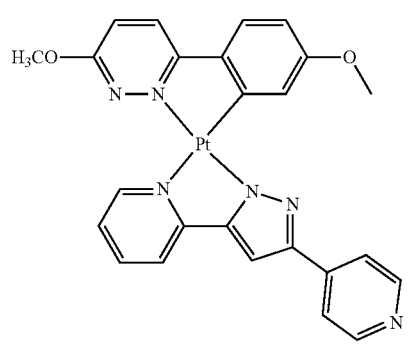
20
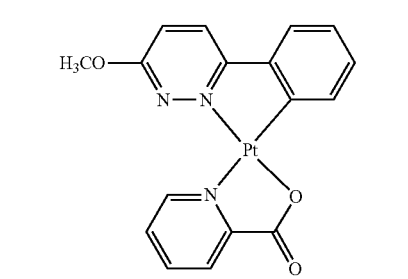
21
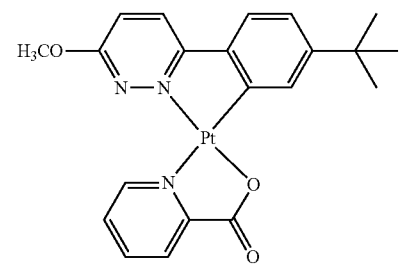
22
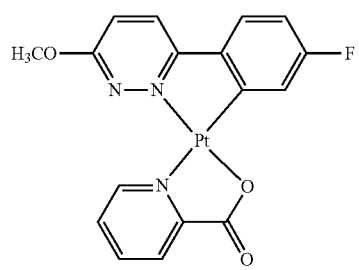
23
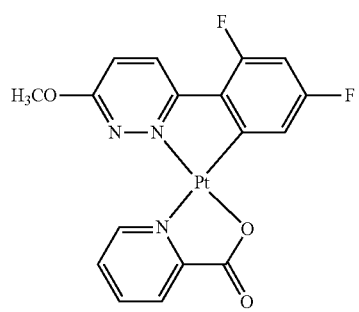
24
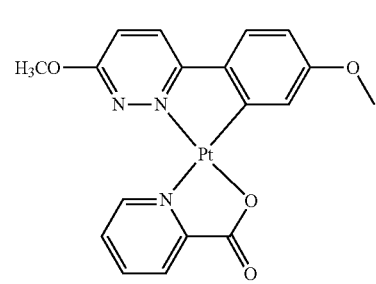
25
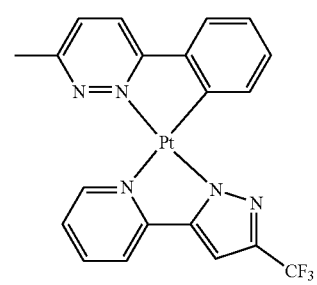
26
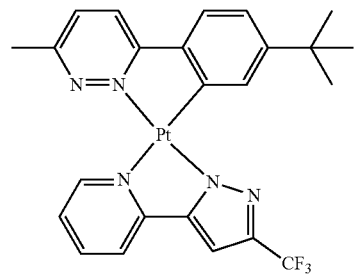
27

-continued

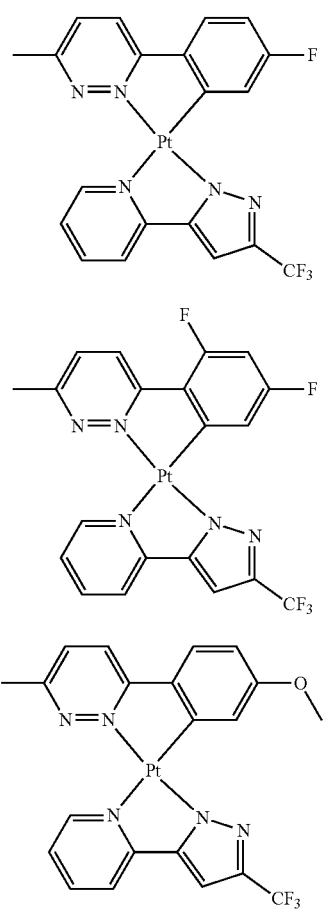

11. The organometallic complex of claim 1, wherein in a thermogravimetric analysis of the organometallic complex, a temperature at which a weight loss of 5% compared to an initial weight occurs is greater than or equal to about 300° C.

12. The organometallic complex of claim 1, wherein a peak wavelength of an emission spectrum of the organometallic complex in a solid state is located at a longer wavelength than a peak wavelength of the emission spectrum of the organometallic complex in a solution state.

13. A light emitting diode, comprising
a first electrode and a second electrode, and
a light emitting layer between the first electrode and the second electrode,
wherein the light emitting layer includes the organometallic complex of claim 1.

14. The light emitting diode of claim 13, wherein a peak wavelength of the emission spectrum of the light emitting layer is in the range of about 580 nm to 1200 nm.

15. A display panel comprising the light emitting diode of claim 13.

16. A sensor comprising the light emitting diode of claim 13.

17. An electronic device comprising the light emitting diode of claim 13.

* * * * *